(12) United States Patent
Toyoshima et al.

(10) Patent No.: US 10,216,346 B2
(45) Date of Patent: *Feb. 26, 2019

(54) DISPLAY DEVICE WITH CAPACITIVE TOUCH PANEL

(71) Applicant: ZEON CORPORATION, Tokyo (JP)

(72) Inventors: Tetsuya Toyoshima, Tokyo (JP); Shunsuke Yamanaka, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,039

(22) Filed: Nov. 27, 2017

(65) Prior Publication Data

US 2018/0081469 A1 Mar. 22, 2018

Related U.S. Application Data

(63) Continuation of application No. 14/782,714, filed as application No. PCT/JP2014/001965 on Apr. 4, 2014, now Pat. No. 9,870,107.

(30) Foreign Application Priority Data

Apr. 10, 2013 (JP) ................................ 2013-081833

(51) Int. Cl.
*G06F 3/044* (2006.01)
*G02B 5/30* (2006.01)
(Continued)

(52) U.S. Cl.
CPC .............. *G06F 3/044* (2013.01); *G02B 1/16* (2015.01); *G02B 1/18* (2015.01); *G02B 5/30* (2013.01);
(Continued)

(58) Field of Classification Search
None
See application file for complete search history.

(56) References Cited

U.S. PATENT DOCUMENTS 9,377,571 B2 6/2016 Jeon et al.
2002/0008840 A1 1/2002 Sakamaki et al.
(Continued)

FOREIGN PATENT DOCUMENTS

CN 1552015 A 12/2004
CN 101140334 A 3/2008
(Continued)

OTHER PUBLICATIONS

Jun. 17, 2014 International Search Report issued in International Patent Application No. PCT/JP2014/001965.
(Continued)

*Primary Examiner* — Duane N Taylor, Jr.
(74) *Attorney, Agent, or Firm* — Oliff PLC

(57) ABSTRACT

A display device with a capacitive touch panel includes a laminate between a display panel and a cover layer, the laminate having a circularly polarizing plate, a first conductive layer, and a second conductive layer. The circularly polarizing plate includes a substrate and a polarizing plate. The first conductive layer, the second conductive layer, and the substrate are positioned closer to the display panel than is the polarizing plate, and the first conductive layer is positioned closer to the cover layer than is the second conductive layer. The first and second conductive layers are arranged apart from each other in a stacking direction so as to form a capacitive touch sensor. One of the first and second conductive layers is formed on one surface of the substrate. The substrate has an optical film with a phase difference of λ/4. The polarizing plate has a polarizing film.

11 Claims, 11 Drawing Sheets

(51) Int. Cl.
| | |
|---|---|
| *H01L 51/50* | (2006.01) |
| *H01L 27/32* | (2006.01) |
| *G02F 1/1333* | (2006.01) |
| *G02F 1/1335* | (2006.01) |
| *G02B 1/18* | (2015.01) |
| *G06F 3/041* | (2006.01) |
| *G09G 3/3208* | (2016.01) |
| *G02B 1/16* | (2015.01) |
| *G02F 1/13363* | (2006.01) |

(52) U.S. Cl.
CPC ......... *G02B 5/3033* (2013.01); *G02B 5/3041* (2013.01); *G02B 5/3083* (2013.01); *G02F 1/13338* (2013.01); *G02F 1/133502* (2013.01); *G06F 3/0412* (2013.01); *G09G 3/3208* (2013.01); *H01L 27/323* (2013.01); *H01L 51/50* (2013.01); *H05K 999/99* (2013.01); *B32B 2307/202* (2013.01); *B32B 2307/42* (2013.01); *B32B 2457/20* (2013.01); *B32B 2457/208* (2013.01); *G02F 2001/133541* (2013.01); *G02F 2001/133638* (2013.01); *G02F 2201/38* (2013.01); *G06F 2203/04103* (2013.01)

(56) References Cited

U.S. PATENT DOCUMENTS

| | | | |
|---|---|---|---|
| 2004/0017364 A1* | 1/2004 | Tanaka | G02F 1/13338 345/173 |
| 2004/0239641 A1 | 12/2004 | Takahata et al. | |
| 2008/0068545 A1 | 3/2008 | Doi et al. | |
| 2009/0015761 A1* | 1/2009 | Stockham | G06F 3/0412 349/96 |
| 2009/0096761 A1 | 4/2009 | Cho | |
| 2010/0233930 A1* | 9/2010 | Ishida | G06F 3/0412 445/24 |
| 2011/0026120 A1* | 2/2011 | Suzuki | G02B 1/111 359/580 |
| 2012/0288672 A1* | 11/2012 | Ogilvie | B29C 65/4895 428/141 |
| 2013/0016047 A1 | 1/2013 | Masumoto | |
| 2013/0222282 A1* | 8/2013 | Huang | G06F 3/044 345/173 |
| 2013/0222317 A1* | 8/2013 | Abiru | G02F 1/13338 345/173 |
| 2013/0258570 A1 | 10/2013 | Nashiki et al. | |
| 2014/0134432 A1 | 5/2014 | Higashi et al. | |
| 2014/0247487 A1* | 9/2014 | Jeon | G02B 5/3083 359/489.07 |
| 2015/0029412 A1 | 1/2015 | Kishioka et al. | |
| 2015/0357599 A1* | 12/2015 | Kawakami | C08F 20/56 428/412 |

FOREIGN PATENT DOCUMENTS

| | | |
|---|---|---|
| EP | 1424625 A1 | 6/2004 |
| EP | 1898252 A1 | 3/2008 |
| JP | S50-83482 A | 7/1975 |
| JP | H02-113920 A | 4/1990 |
| JP | H03-182701 A | 8/1991 |
| JP | 2000-009912 A | 1/2000 |
| JP | 2001-060144 A | 3/2001 |
| JP | 2001-147777 A | 5/2001 |
| JP | 2002-022944 A | 1/2002 |
| JP | 2002-086554 A | 3/2002 |
| JP | 2002-311239 A | 10/2002 |
| JP | 2003-131233 A | 5/2003 |
| JP | 2003-157149 A | 5/2003 |
| JP | 2008-129465 A | 6/2008 |
| JP | 2009-099141 A | 5/2009 |
| JP | 2009-283349 A | 12/2009 |
| JP | 2010-039458 A | 2/2010 |
| JP | 2011-152736 A | 8/2011 |
| JP | 2011-198207 A | 10/2011 |
| JP | 2012-206343 A | 10/2012 |
| JP | 2013-003952 A | 1/2013 |
| JP | 2013-041566 A | 2/2013 |
| JP | 3182382 U | 3/2013 |
| KR | 2013-0016135 A | 2/2013 |
| WO | 2012/073964 A1 | 6/2012 |
| WO | 2013/002184 A1 | 1/2013 |

OTHER PUBLICATIONS

Oct. 13, 2015 International Preliminary Report on Patentability issued in International Patent Application No. PCT/JP2014/001965.
Feb. 2, 2017 Office Action issued in U.S. Appl. No. 14/782,714.
Aug. 25, 2017 Notice of Allowance issued in U.S. Appl. No. 14/782,714.
Nov. 23, 2018 Office Action issued in U.S. Appl. No. 16/148,450.

\* cited by examiner

DISPLAY DEVICE WITH CAPACITIVE TOUCH PANEL

CROSS-REFERENCE

This application is a Continuation of U.S. application Ser. No. 14/782,714, filed Oct. 6, 2015, which is a National Stage entry of International Application No. PCT/JP2014/001965, filed Apr. 4, 2014, which claims the priority of Japanese Patent Application No. JP 2013-081833, filed Apr. 10, 2013. The entire disclosures of the above-referenced applications are incorporated by reference herein.

TECHNICAL FIELD

This disclosure relates to a display device with a touch panel, in particular to a display device with a capacitive touch panel.

BACKGROUND

As displays combined with input means, display devices with touch panels are widely used in electronics, such as laptop computers, OA equipment, medical equipment, car navigation devices, portable electronic devices such as mobile phones, and personal digital assistants (PDAs). Here, different types of touch panels are known, including capacitive type, optical type, ultrasonic type, electromagnetic induction type, resistance film type, and the like. Among these, in particular, capacitive type, which detects input coordinates by monitoring changes in the electrostatic capacity between a finger tip and a conductive layer, is becoming the mainstream of current touch panels on par with resistance film type.

As a conventional display device with a capacitive touch panel, for example, a device is known to have: a display panel formed by an organic EL display (OLED) panel and a barrier glass layer which is positioned closer to the viewing side than is the OLED panel; an anti-reflective circularly polarizing plate formed by a quarter wavelength plate and a polarizing plate which is positioned closer to the viewing side than is the quarter wavelength plate; a touch sensor unit; and a cover glass layer, which are stacked in the stated order from the light emitting side towards the viewing side (for example, JP2013-41566A (PTL 1)). Additionally, a conventional display device with a capacitive touch panel has a touch sensor unit that is formed with, for example, two transparent base plates, each having a conductive layer formed on a surface thereof, stacked together such that the conductive layer of one transparent base plate face a surface of the other transparent base plate on the side opposite where the conductive layer of the other transparent base plate is formed (for example, JP2013-3952A (PTL 2)).

Such a conventional display device with a capacitive touch panel has a function for preventing incident external light (natural light) being reflected at the surface of the OLED panel (particularly the surface of an electrode in the OLED panel) from making visual recognition of the displayed content difficult.

CITATION LIST

Patent Literature

PTL 1: JP2013-41566A
PTL 2: JP2013-3952A

SUMMARY

Technical Problem

Recently, there is increasing demand for further reduction in the thickness and weight of display devices with capacitive touch panels. However, the above conventional display devices with capacitive touch panels have the problem that since a touch sensor unit is formed with two transparent base plates, each having a conductive layer formed on a surface thereof, the thickness between the OLED panel and the cover glass layer increases, which results in an increase in the thickness of the entire device.

Therefore, an object of the disclosure is to provide a display device with a capacitive touch panel that can prevent reflected light of incident external light from making visual recognition of the displayed content difficult, and that is reduced in thickness.

Solution to Problem

To solve the aforementioned problem advantageously, it could thus be helpful to provide a display device with a capacitive touch panel comprising a laminate between a display panel and a cover layer, the laminate having a circularly polarizing plate, a first conductive layer, and a second conductive layer, wherein the circularly polarizing plate comprises a substrate and a polarizing plate, the first conductive layer, the second conductive layer, and the substrate are positioned closer to the display panel than is the polarizing plate, and the first conductive layer is positioned closer to the cover layer than is the second conductive layer, the first conductive layer and the second conductive layer are arranged apart from each other in a stacking direction so as to form a capacitive touch sensor, one of the first conductive layer and the second conductive layer is formed on one surface of the substrate, the substrate has an optical film with a phase difference of $\lambda/4$, and the polarizing plate has a polarizing film. In this way, when the circularly polarizing plate comprising, at a position closer to the display panel than is the polarizing plate, the substrate having the optical film for imparting a phase difference of $\lambda/4$ to light is provided between the display panel and the cover layer, it is possible to prevent reflected light of incident external light from making visual recognition of the displayed content difficult. In addition, when one of the first conductive layer and the second conductive layer is formed on the substrate, a transparent base plate is no longer needed for forming the conductive layer, and it is thus possible to simplify the structure of the touch sensor, thereby reducing the thickness between the display panel and the cover layer.

As used herein, the "circularly polarizing plate" refers to a member that is capable of converting light incident from the cover layer side towards the display panel side into linearly polarized light, then converting the linearly polarized light into circularly polarized light, and further converting reverse circularly polarized light resulting from the circularly polarized light reflected at the display panel, into another linearly polarized light orthogonal to the linearly polarized light, to thereby prevent transmission of the reflected light into the cover layer side, and that comprises, at least, a polarizing plate and an optical film with a phase difference of $\lambda/4$ arranged closer to the display panel than is the polarizing plate. Specifically, examples of the "circularly polarizing plate" include: one having a polarizing plate formed with a polarizing film and an optical film with a phase difference of $\lambda/4$ sequentially stacked in a manner such that a slow axis of the optical film intersects a transmission axis of the polarizing film at a predetermined angle; and one having a polarizing plate formed with a polarizing film, an optical film with a phase difference of λ/2, and an optical film with a phase difference of λ/4 sequentially stacked in a manner such that respective slow axes of the optical films intersect a transmission axis of the polarizing film at a predetermined angle. It is noted that the polarizing plate and optical films constituting the polarizing plate may be arranged apart from each other in the stacking direction, or another member may be interposed between the polarizing plate and the optical films, or alternatively, between the optical films.

Here, in the display device with a capacitive touch panel disclosed herein, it is preferred that the polarizing plate has a display panel-side protective film on a surface of the polarizing film on the side of the display panel, the first conductive layer is formed on a surface of the display panel-side protective film on the side of the display panel, the second conductive layer is formed on one surface of the substrate, and a slow axis of the optical film intersects a transmission axis of the polarizing film at an angle of about 45° as viewed in the stacking direction. By setting the angle at which the slow axis of the optical film intersects the transmission axis of the polarizing film to about 45°, it is possible to prevent reflected light of incident external light from making visual recognition of the displayed content difficult.

As used herein, "about 45°" covers angles of, for example, 45°±5°, at which it is possible to prevent reflected light of incident external light from making visual recognition of the displayed content difficult.

In this case, it is noted that the substrate may be positioned between the first conductive layer and the second conductive layer. When the substrate is arranged between the first conductive layer and second conductive layer, a capacitive touch sensor can be easily formed.

Also, in this case, the substrate may be positioned between the second conductive layer and the display panel.

Moreover, in this case, the optical film preferably has reverse wavelength dispersion characteristics. In this way, the phase difference imparted to light incident on the optical film increases in absolute value with increasing wavelength of the light and decreases in absolute value with decreasing wavelength of the light, and therefore desirable polarization characteristics can be obtained over a wide wavelength range, which makes it possible to convert linearly polarized light into circularly polarized light in a favorable manner.

Here, in the display device with a capacitive touch panel disclosed herein, it is preferred that the polarizing film is positioned on a surface of the polarizing plate on the side of the display panel, the substrate is bonded to a surface of the polarizing film on the side of the display panel, another substrate is further provided between the substrate and the display panel, the first conductive layer is formed on a surface of the substrate on the side of the display panel, the second conductive layer is formed on one surface of the other substrate, and a slow axis of the optical film intersects a transmission axis of the polarizing film at an angle of about 45° as viewed in the stacking direction. By setting the angle at which the slow axis of the optical film intersects the transmission axis of the polarizing film to about 45°, it is possible to prevent reflected light of incident external light from making visual recognition of the displayed content difficult.

In addition, when the polarizing film is positioned on the surface of the polarizing plate on the side of the display panel and the substrate is bonded to the surface of the polarizing film on the side of the display panel, it is possible to use the substrate as a protective film for the polarizing film. As a result, the display panel-side protective film of the polarizing plate is no longer needed, and the thickness of the polarizing plate can be reduced.

In this case, it is noted that the other substrate may be positioned between the first conductive layer and the second conductive layer. When the other substrate is arranged between the first conductive layer and second conductive layer, a capacitive touch sensor can be easily formed.

Also, in this case, the other substrate may be positioned between the second conductive layer and the display panel.

Additionally, in this case, the optical film preferably has reverse wavelength dispersion characteristics. In this way, the phase difference imparted to light incident on the optical film increases in absolute value with increasing wavelength of the light, and decreases in absolute value with decreasing wavelength of the light, and thus desirable polarization characteristics can be obtained over a wide wavelength range, which makes it possible to convert linearly polarized light into circularly polarized light.

In this case, it is also preferred that the other substrate has a substrate layer and the substrate layer has a relative permittivity of 2 or more and 5 or less. Moreover, it is preferred that the other substrate has a substrate layer and the substrate layer has a saturated water absorption of 0.01 mass % or less. When the above substrate layer is used in the other substrate, a capacitive touch sensor can be formed favorably.

In addition, in the display device with a capacitive touch panel disclosed herein, it is preferred that the circularly polarizing plate further comprises a polarizing plate-side substrate positioned between the substrate and the polarizing plate, the polarizing film is positioned on a surface of the polarizing plate on the side of the display panel, the polarizing plate-side substrate is bonded to a surface of the polarizing film on the side of the display panel, the first conductive layer is formed on a surface of the polarizing plate-side substrate on the side of the display panel, the second conductive layer is formed on one surface of the substrate, a slow axis of the optical film intersects a transmission axis of the polarizing film at an angle of about 75° as viewed in the stacking direction, the polarizing plate-side substrate has another optical film with a phase difference of λ/2, and a slow axis of the other optical film intersects the transmission axis of the polarizing film at an angle of about 15° as viewed in the stacking direction. By setting the angle at which the slow axis of the optical film intersects the transmission axis of the polarizing film to about 75°, and by setting the angle at which the slow axis of the other optical film intersects the transmission axis of the polarizing film to about 15°, it is possible to form a so-called wideband quarter wavelength plate by using the optical film and the other optical film, to yield desired polarization characteristics in a wide wavelength range, and to convert linearly polarized light into circularly polarized light favorably. Therefore, it is possible to prevent reflected light of incident external light from making visual recognition of the displayed content difficult. In addition, when the polarizing film is positioned on the surface of the polarizing plate on the side of the display panel and the polarizing plate-side substrate is bonded to the surface of the polarizing film on the side of the display panel, it is possible to use the polarizing plate-side substrate as a protective film for the polarizing film. As a result, the display panel-side protective film of the polarizing plate is no longer needed, and the thickness of the polarizing plate can be reduced.

As used herein, "about 75°" and "about 15°" cover angles of, for example, "75°±5°" and "15°±5°", respectively, at which it is possible to form a wideband quarter wavelength plate to prevent reflected light of incident external light from making visual recognition of the displayed content difficult. Additionally, "about 75°" and "about 15°" represent angles measured in the same direction with respect to the transmission axis of the polarizing film.

Moreover, in the display device with a capacitive touch panel disclosed herein, it is preferred that the circularly polarizing plate further comprises a polarizing plate-side substrate positioned between the substrate and the polarizing plate, the polarizing film is positioned on a surface of the polarizing plate on the side of the display panel, the polarizing plate-side substrate is bonded to a surface of the polarizing film on the side of the display panel, the first conductive layer is formed on a surface of the polarizing plate-side substrate on the side of the display panel, the second conductive layer is formed on one surface of the substrate, a slow axis of the optical film intersects a transmission axis of the polarizing film at an angle of about 90° as viewed in the stacking direction, the polarizing plate-side substrate has another optical film with a phase difference of λ/2, and a slow axis of the other optical film intersects the transmission axis of the polarizing film at an angle of about 22.5° as viewed in the stacking direction. By setting the angle at which the slow axis of the optical film intersects the transmission axis of the polarizing film to about 90°, and by setting the angle at which the slow axis of the other optical film intersects the transmission axis of the polarizing film to about 22.5°, it is possible to form a so-called wideband quarter wavelength plate by using the optical film and the other optical film, to yield desired polarization characteristics in a wide wavelength range, and to convert linearly polarized light into circularly polarized light favorably. Therefore, it is possible to prevent reflected light of incident external light from making visual recognition of the displayed content difficult. In addition, when the polarizing film is positioned on the surface of the polarizing plate on the side of the display panel and the polarizing plate-side substrate is bonded to the surface of the polarizing film on the side of the display panel, it is possible to use the polarizing plate-side substrate as a protective film for the polarizing film. As a result, the display panel-side protective film of the polarizing plate is no longer needed, and the thickness of the polarizing plate can be reduced.

As used herein, "about 90°" and "about 22.5°" cover angles of, for example, "90°±5°" and "22.5°±5°", respectively, at which it is possible to form a wideband quarter wavelength plate to prevent reflected light of incident external light from making visual recognition of the displayed content difficult. Additionally, "about 90°" and "about 22.5°" represent angles measured in the same direction with respect to the transmission axis of the polarizing film.

It is noted in these cases that the substrate may be positioned between the first conductive layer and the second conductive layer. When the substrate is arranged between the first conductive layer and second conductive layer, a capacitive touch sensor can be easily formed.

Also, in these cases, the substrate may be positioned between the second conductive layer and the display panel.

In addition, in the display device with a capacitive touch panel disclosed herein, it is preferred that the first conductive layer is formed on one surface of the substrate, the second conductive layer is formed on a surface of the display panel on the side of the cover layer, and a slow axis of the optical film intersects a transmission axis of the polarizing film at an angle of about 45° as viewed in the stacking direction. By setting the angle at which the slow axis of the optical film intersects the transmission axis of the polarizing film to about 45°, it is possible to prevent reflected light of incident external light from making visual recognition of the displayed content difficult.

It is noted in these cases that the substrate may be positioned between the first conductive layer and the second conductive layer. When the substrate is arranged between the first conductive layer and second conductive layer, a capacitive touch sensor can be easily formed.

Also, in these cases, the substrate may be positioned between the first conductive layer and the polarizing plate. Moreover, it is preferred that the polarizing film is positioned on a surface of the polarizing plate on the side of the display panel, the substrate is bonded to a surface of the polarizing film on the side of the display panel. In this way, the substrate can be used as a protective film for the polarizing film, which makes it possible to eliminate the need for the display panel-side protective film of the polarizing plate and to reduce the thickness of the polarizing plate.

In addition, to solve the aforementioned problem advantageously, it could thus be helpful to provide a display device with a capacitive touch panel comprising a laminate between a display panel and a cover layer, the laminate having a circularly polarizing plate, a first conductive layer, and a second conductive layer, wherein the circularly polarizing plate comprises a substrate and a polarizing plate positioned closer to the cover layer than is the substrate, the first conductive layer and the second conductive layer are positioned closer to the cover layer than is the polarizing plate, and the first conductive layer is positioned closer to the cover layer than is the second conductive layer, the first conductive layer and the second conductive layer are arranged apart from each other in a stacking direction so as to form a capacitive touch sensor, the substrate has an optical film with a phase difference of λ/4, and the polarizing plate has a polarizing film and a cover layer-side protective film, the cover layer-side protective film is formed on the side of the cover layer of the polarizing film, the second conductive layer is formed on a surface of the cover layer-side protective film on the side of the cover layer, and a slow axis of the optical film intersects a transmission axis of the polarizing film at an angle of about 45° as viewed in the stacking direction. In this way, when the substrate having the optical film for imparting a phase difference of λ/4 to light is provided closer to the display panel than is the polarizing plate, and by setting the angle at which the slow axis of the optical film intersects the transmission axis of the polarizing film to about 45°, it is possible to convert linearly polarized light traveling from the cover layer side through the polarizing plate towards the display panel side into circularly polarized light, and to convert reverse circularly polarized light resulting from the circularly polarized light reflected at the display panel, into another linearly polarized light orthogonal to the linearly polarized light. Accordingly, it is possible to prevent the transmission of the other linearly polarized light, which is orthogonal to the linearly polarized light traveling from the cover layer side through the polarizing plate towards the display panel side, to thereby prevent reflected light of incident external light from making visual recognition of the displayed content difficult. In addition, when the second conductive layer is formed on the cover layer-side protective film, a separate transparent base plate is no longer needed for forming the conductive layer, and it is thus possible to simplify the structure of the touch sensor, thereby reducing the thickness between the display panel and the cover layer.

Here, in the display device with a capacitive touch panel disclosed herein, the first conductive layer may be formed on a surface of the cover layer on the side of the display panel. When the first conductive layer is formed on the surface of the cover layer, a separate transparent base plate is no longer needed for forming the first conductive layer, and it is thus possible to further simplify the structure of the touch sensor, thereby reducing the thickness between the display panel and the cover layer.

Moreover, it is preferred that the polarizing film is positioned on a surface of the polarizing plate on the side of the display panel and the substrate is bonded to a surface of the polarizing film on the side of the display panel. In this way, the substrate can be used as a protective film for the polarizing film, which makes it possible to eliminate the need for the display panel-side protective film of the polarizing plate and to reduce the thickness of the polarizing plate.

Additionally, in the display device with a capacitive touch panel disclosed herein, it is preferred that the optical film has a relative permittivity of 2 or more and 5 or less. In addition, the optical film preferably has a saturated water absorption of 0.01 mass % or less. Moreover, the optical film and/or the other optical film is preferably formed from a cycloolefin polymer, polycarbonate, polyethylene terephthalate, or triacetylcellulose, and is more preferably a cycloolefin polymer without a polar group. When the aforementioned optical film and/or the other optical film is used in the substrate and/or the polarizing plate-side substrate, a capacitive touch sensor can be formed favorably.

As used herein, the "relative permittivity" may be measured in accordance with ASTM D150. Also, as used herein, the "saturated water absorption" may be measured following ASTM D570.

Additionally, in the display device with a capacitive touch panel disclosed herein, it is preferred that the optical film and/or the other optical film is an obliquely stretched film. When the optical film and/or the other optical film is an obliquely stretched film, a laminate including the polarizing plate and the optical film and/or the other optical film can be produced easily by a roll-to-roll process.

Additionally, in the display device with a capacitive touch panel disclosed herein, it is preferred that the first conductive layer and the second conductive layer are formed by using indium tin oxide, carbon nanotubes, or silver nanowires.

It is also preferred that the display panel comprises an organic EL display panel.

Additionally, in the display device with a capacitive touch panel disclosed herein, it is preferred that the display device has no index matching layer. In this way, it is possible to simplify the structure of the touch sensor and reduce the thickness between the display panel and the cover layer.

Advantageous Effect

According to the disclosure, it is possible to provide a display device with a capacitive touch panel that can prevent reflected light of incident external light from making visual recognition of the displayed content difficult, and that is reduced in thickness.

DETAILED DESCRIPTION

Figure 1:
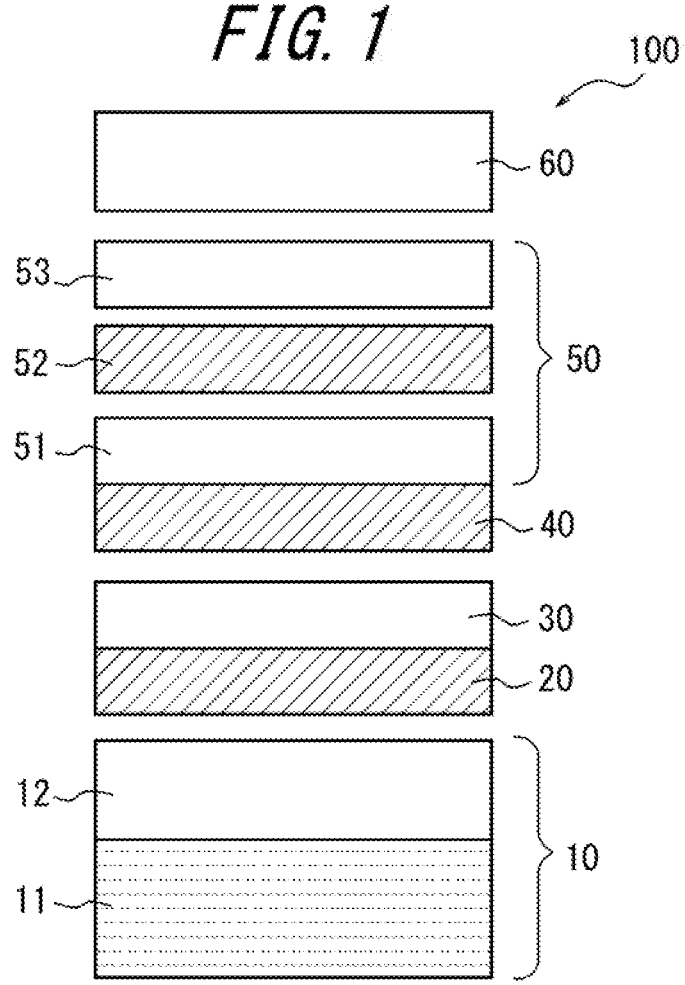
FIG. 1 is a diagram schematically illustrating a cross-sectional structure of the main part of a first display device with a capacitive touch panel according to the disclosure.

Embodiments of the disclosed display device with a capacitive touch panel will be described in detail with reference to the drawings. It is noted that the same reference numerals indicate the same components throughout the drawings. It is also noted that an additional layer or film may also be provided in any space between the members illustrated in the drawings within a range in which the object of the disclosure can be achieved. Here, examples of such additional layers or films include adhesive layers or pressure sensitive adhesive layers that are used to bond members together into a single structure. Preferred adhesive layers or pressure sensitive adhesive layers are transparent to visible light and do not cause any unnecessary phase difference.

Display Device with Capacitive Touch Panel (First Embodiment)

FIG. 1 schematically illustrates a cross-sectional structure of the main part of a first display device with a capacitive touch panel according to the disclosure. It is noted here that the display device with a capacitive touch panel 100 illustrated in FIG. 1 is a device that has both a display function and a touch sensor function, the display function for displaying image information on the screen and the touch sensor function for detecting a position on the screen touched by the operator and outputting it as an information signal to the outside.

The display device with a capacitive touch panel 100 comprises the following members stacked in the stated order from the side on which an organic EL display (OLED) panel is arranged (the lower side of FIG. 1, and this side is hereinafter referred to simply as the "display panel side") towards the side from which the operator views an image (the upper side of FIG. 1, and this side is hereinafter referred to simply as the "viewing side"): as a display panel 10, an organic EL display (OLED) panel 11 and a barrier layer 12; a second conductive layer 20; a substrate 30; a first conductive layer 40; as a polarizing plate 50, a display panel-side protective film 51, a polarizing film 52, and a cover layer-side protective film 53; and a cover layer 60. Additionally, in the display device with a capacitive touch panel 100, the first conductive layer 40 is formed on one surface of the display panel-side protective film 51 (that is located on the display panel 10 side), and the second conductive layer 20 is formed on one surface of the substrate 30 (that is located on the display panel 10 side). In addition, in the display device 100, the polarizing plate 50 and the substrate 30 positioned closer to the display panel 10 than is the polarizing plate 50 constitute a circularly polarizing plate.

It is noted that the display panel 10, the substrate 30 formed with the second conductive layer 20, the display panel-side protective film 51 formed with the first conductive layer 40, the polarizing film 52, the cover layer-side protective film 53, and the cover layer 60 may be integrated into a single structure by bonding the members together using known means, such as providing adhesive layers or pressure sensitive adhesive layers, performing plasma treatment on the surfaces of members, and the like. That is, for example, adhesive layers or pressure sensitive adhesive layers are formed in gaps in the layered structure illustrated in FIG. 1.

[Organic EL Display (OLED) Panel]

As the organic EL display (OLED) panel 11, for example, an organic EL display (OLED) panel may be used that has, on a surface of a transparent base plate, a transparent electrode formed from a transparent electrode material, a light-emitting layer stacked on the transparent electrode and made from an EL material, and a back electrode stacked on the light-emitting layer and formed opposite to the transparent electrode, and that emits light on the transparent base plate side. Additionally, in the display device with a capacitive touch panel 100, the organic EL display (OLED) panel 11 is energized to present a desired image to the operator.

It is noted that any known material may be used as the transparent electrode, the light-emitting layer, and the back electrode. In addition, the display panel which may be used in the display device with a capacitive touch panel disclosed herein is not limited to the one using the organic EL display (OLED) panel 11 with the aforementioned structure.

[Barrier Layer]

The barrier layer 12 positioned on the viewing side of the organic EL display (OLED) panel 11 may be formed by using a known member, for example, a plate that is made of glass or plastic and is transparent to visible light.

[Second Conductive Layer]

The second conductive layer 20 is formed on one surface of the substrate 30, and is positioned between the barrier layer 12 and the substrate 30. Additionally, the second conductive layer 20 forms a capacitive touch sensor, in conjunction with the first conductive layer 40 as detailed below.

Here, the second conductive layer 20 may be any layer as long as it has transmittance in the visible light region and has conductivity, and may be formed by using any suitable material including, but not particularly limited to, conductive polymers; conductive pastes such as silver paste and polymer paste; metal colloids such as gold and copper; metal oxides such as indium tin oxide (tin-doped indium oxide: ITO), antimony-doped tin oxide (ATO), fluorine-doped tin oxide (FTO), aluminum-doped zinc oxide (AZO), cadmium oxide, cadmium-tin oxide, titanium oxide, and zinc oxide; metal compounds such as copper iodide; metals such as gold (Au), silver (Ag), platinum (Pt), and palladium (Pd); and inorganic or organic nanomaterials such as silver nanowires and carbon nanotubes (CNTs). Among these, indium tin oxide, carbon nanotubes, and silver nanowires are preferred, and particularly preferred is indium tin oxide from a light transmittivity and durability perspective.

It is noted that when CNTs are used, any of single-walled CNTs, double-walled CNTs, triple- or higher order multi-walled CNTs may be used, yet the diameter of the CNTs used is preferably from 0.3 nm to 100 nm and the length thereof is preferably from 0.1 μm to 20 μm. It is noted that from the viewpoint of increasing transparency of conductive layers and reducing the surface resistance, single-walled CNTs or double-walled CNTs of 10 nm or less in diameter and 1 μm to 10 μm in length are preferably used. It is also preferred that the collection of CNTs contain as few impurities as possible, such as amorphous carbon and catalyst metal.

Additionally, the formation of the second conductive layer 20 on the surface of the substrate 30 is not particularly limited, and may be performed by a sputtering method, a vacuum evaporation method, a CVD method, an ion plating method, a sol-gel method, a coating method, or the like.

[Substrate with Optical Film]

Figure 2:
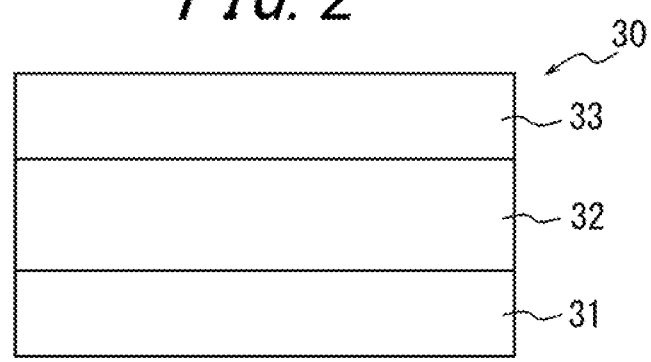
FIG. 2 is a diagram schematically illustrating a cross-sectional structure of the substrate 30 in FIG. 1.

The substrate 30 is positioned between the first conductive layer 40 and the second conductive layer 20. As illustrated in FIG. 2, the substrate 30 has an optical film 32 with a phase difference of λ/4 and hard coat layers 31, 33 fomred on opposite surfaces of the optical film 32. Additionally, the optical film 32 of the substrate 30 is arranged so that a slow axis of the optical film 32 and a transmission axis of a polarizing film 52 of a polarizing plate 50 as detailed below intersect at a predetermined angle as viewed in the stacking direction.

As used herein, "a predetermined angle" refers to an angle at which a circularly polarizing plate can be formed by the polarizing plate 50 and the optical film 32, and it is possible to prevent reflected light of incident external light from making visual recognition of the displayed content difficult. Specifically, the predetermined angle is an angle at which linearly polarized light traveling from the cover layer 60 side through the polarizing plate 50 towards the display panel 10 side can be converted by the optical film 32 into circularly polarized light (for example, about 45°), and more specifically covers angles of 45°±5°, preferably 45°±3°, more preferably 45°±1°, and even more preferably 45°±0.3°.

In addition, the phrase "with a phase difference of λ/4" indicates that the phase difference (retardation Re) to be applied to light transmitted through the optical film 32 in the stacking direction is about ¼ times the wavelength λ of the light. Specifically, in the case where the transmitted light has a wavelength range from 400 nm to 700 nm, and when Re is about ¼ times the wavelength λ, it is meant that Re is in the range of λ/4±65 nm, preferably in the range of λ/4±30 nm, and more preferably in the range of λ/4±10 nm. It is noted that Re is the retardation in the in-plane direction represented by the equation Re=(nx−ny)×d, where nx is the refractive index in the film plane in the slow axis direction, ny is the refractive index in a direction orthogonal, in the film plane, to the slow axis in the film plane, and d is the thickness of the optical film 32.

[[Optical Film]]

As the optical film 32, it is possible to use a film subjected to orientation treatment that is obtained by forming a thermoplastic resin into a film and stretching the film.

Figure 12:
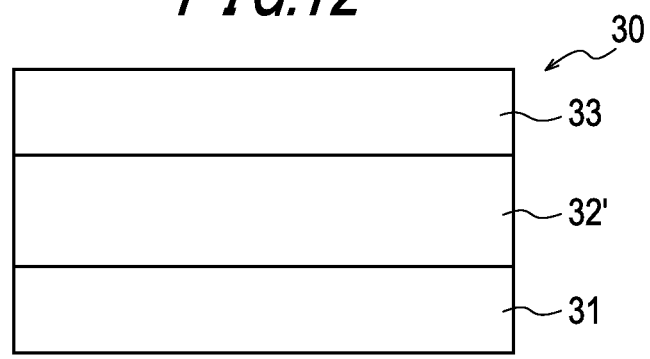
FIG. 12 is a diagram schematically illustrating a cross-sectional structure of the substrate 30 in FIG. 1.

Here, a thermoplastic resin may be stretched by any known stretching method, yet a preferred method is oblique stretching. The reason is as described below. Although the optical film 32 needs to be stacked such that the slow axis of the optical film 32 and the transmission axis of the polarizing film 52 of the polarizing plate 50 intersect at a predetermined angle, a stretched film subjected to general stretching treatment (vertical stretching treatment or horizontal stretching treatment) has an optical axis oriented in a direction either parallel or orthogonal to the width direction of the film. Accordingly, to stack the general stretched film and the polarizing film one on top of the other at a predetermined angle, the stretched film needs to be cut at an angle into a sheet of material. An obliquely stretched film, however, has an optical axis oriented in a direction inclined at an angle with respect to the width direction of the film. Accordingly, when an obliquely stretched film is used as the optical film 32 (as shown in FIG. 12), a laminate including the polarizing plate 50 and the optical film 32 can be produced easily by a roll-to-roll process.

Methods for use in the oblique stretching may include those described in JPS50-83482A, JPH2-113920A, JPH3-182701A, JP2000-9912A, JP2002-86554A, JP2002-22944A, and the like. The stretching machine used for oblique stretching is not particularly limited, and a possible stretching machine is a conventionally known tenter-type stretching machine. Although there are different types of tenter-type stretching machines including horizontal uniaxial stretching machines and simultaneous biaxial stretching machines, the stretching machine used is not limited to a particular type, but rather may be selected from a variety of stretching machines as long as it allows for continuous oblique stretching of a long film.

In addition, the temperature at which the thermoplastic resin is subjected to oblique stretching is preferably in the range of Tg−30° C. to Tg+60° C., and more preferably in the range of Tg−10° C. to Tg+50° C., where Tg is the glass-transition temperature of the thermoplastic resin. In addition, the stretching ratio is normally from 1.01 times to 30 times, preferably from 1.01 times to 10 times, and more preferably from 1.01 times to 5 times.

Examples of the thermoplastic resins which can be used to form the optical film 32 include, but are not limited to, cycloolefin polymers, polycarbonate, polyarylate, polyethylene terephthalate, triacetyl cellulose, polysulfone, polyethersulfone, polyphenylene sulfide, polyimide, polyamide imide, polyethylene, polypropylene, polyvinyl chloride, polystyrene, polyolefin, polyvinyl alcohol, and polyvinyl chloride-polymethyl methacrylate. Among these, preferred are cycloolefin polymers, polycarbonate, polyethylene terephthalate, and triacetyl cellulose, more preferred are cycloolefin polymers because of their low relative permittivity, and particularly preferred are cycloolefin polymers without a polar group such as an amino group, a carboxyl group, and a hydroxyl group because of their low relative permittivity and low water absorption.

Examples of cycloolefin polymers may include norbornene-based resins, monocyclic olefin-based resins, cyclic conjugated diene-based resins, vinyl alicyclic hydrocarbon-based resins, and hydrides thereof. Among these, norbornene-based resins are suitably used because of their good transparency and good formability.

Examples of norbornene-based resins may include: a ring-opened polymer of a monomer with norbornene structure, a ring-opened copolymer of a monomer with norbornene structure and another monomer, and hydrides thereof; and an addition polymer of a monomer with norbornene structure, an addition copolymer of a monomer with norbornene structure and another monomer, and hydrides thereof.

Examples of commercially available cycloolefin polymers include "Topas" manufactured by Ticona GmbH, "ARTON" (manufactured by JSR Corporation), "ZEONOR" and "ZEONEX" (manufactured by Zeon Corporation), "APEL" (manufactured by Mitsui Chemicals, Inc.), all of which are trade names. By forming such a cycloolefin-based resin into a film, the optical film 32 made from a thermoplastic resin can be obtained. For film formation, a known film formation method is appropriately used, such as a solvent casting method and a melt extrusion method. Cycloolefin-based resin films obtained by a film formation method are also commercially available, and examples thereof include "Essina" and "SCA40" (manufactured by Sekisui Chemical Co., Ltd.), "ZEONOR Film" (manufactured by Zeon Corporation), and "ARTON FILM" (manufactured by JSR Corporation), all of which are trade names. A thermoplastic resin film before stretching is generally a long unstretched film. In this context, a "long" film indicates a film having a length of at least about 5 times or more, preferably 10 times or more, the width of the film, and specifically a film having a length long enough for the film to be wound into a roll for storage or transportation.

The aforementioned thermoplastic resin has a glass-transition temperature of preferably 80° C. or higher, and more preferably from 100° C. to 250° C. In addition, the photoelastic coefficient of the thermoplastic resin is, in absolute value, preferably $10 \times 10^{-12}$ Pa$^{-1}$ or less, more preferably $7 \times 10^{-12}$ Pa$^{-1}$ or less, and particularly preferably $4 \times 10^{-12}$ Pa$^{-1}$ or less. Photoelastic coefficient C is a value represented by C=Δn/σ, where Δn is birefringence and σ is stress. By using a transparent resin whose photoelastic coefficient falls within this range, it is possible to reduce variations in in-plane direction retardation Re of the optical film. Moreover, when such an optical film is applied to a display device using an organic EL display (OLED) panel, it is possible to suppress a phenomenon that alters the hue at edges of the display screen of the display device.

It is noted that the thermoplastic resin used to form the optical film 32 may be blended with other compounding agents. The compounding agents are not particularly limited, and examples thereof include layered crystal compounds; inorganic fine particles; stabilizers such as antioxidants, heat stabilizers, light stabilizers, weathering stabilizers, ultraviolet absorbers, and near-infrared absorbers; resin modifiers such as lubricants and plasticizers; coloring agents such as dyes and pigments; and antistatic agents. These compounding agents may be used alone or in combination of two or more, and the blending amount thereof is properly selected within a range not to impair the object of the disclosure.

Examples of antioxidants include phenolic antioxidants, phosphoric antioxidants, and sulfuric antioxidants, and among these preferred are phenolic antioxidants, and particularly preferred are alkyl-substituted phenolic antioxidants. By blending these antioxidants, it is possible to prevent coloring of the film and decrease in strength of the film due to oxidation deterioration during the film formation, without deteriorating transparency, low water absorption properties, and the like. These antioxidants may be used alone or in combination of two or more, and the blending amount thereof is properly selected within a range not to impair the object of the disclosure, yet is normally 0.001 parts by mass to 5 parts by mass, and preferably 0.01 parts by mass to 1 part by mass, per 100 parts by mass of the thermoplastic resin.

Inorganic fine particles that have an average particle size of 0.7 μm to 2.5 μm and a refractive index of 1.45 to 1.55 are preferred. Specific examples thereof include clay, talc, silica, zeolite, and hydrotalcite, and among these preferred are silica, zeolite, and hydrotalcite. The addition amount of inorganic fine particles is not particularly limited, yet is normally 0.001 parts by mass to 10 parts by mass, and preferably 0.005 parts by mass to 5 parts by mass, per 100 parts by mass of the thermoplastic resin.

Examples of lubricants include hydrocarbon-based lubricants; fatty acid-based lubricants; higher alcohol-based lubricants; fatty acid amide-based lubricants; fatty acid ester-based lubricants; and metallic soap-based lubricants. Among these, preferred are hydrocarbon-based lubricants, fatty acid amide-based lubricants, and fatty acid ester-based lubricants. Further, of these preferred lubricants, particularly preferred are those having a melting point of 80° C. to 150° C. and an acid value of 10 mg KOH/mg or lower. If the melting point is out of the range of 80° C. to 150° C. and in addition the acid value is greater than 10 mg KOH/mg, the haze value can increase.

Additionally, the thickness of the stretched film used as the optical film 32 is, for example, suitably set in the range of approximately 5 μm to 200 μm, and is preferably from 20 μm to 100 μm. If the thickness of the film is excessively small, strength or retardation value can be insufficient, while the thickness is excessively large, transparency can be deteriorated and it can be difficult to obtain a desired retardation value.

In addition, for the stretched film used as the optical film 32, it is preferred that the content of volatile components remaining in the film is 100 ppm by mass or less. A stretched film whose volatile component content is in the above range is free from display unevenness even after prolonged use, and presents great stability of optical properties. Here, the volatile components are substances that are contained in trace amounts in the thermoplastic resin, that have a molecular weight of 200 or less, and that have a relatively low boiling point, and examples thereof include residual monomers remained in the thermoplastic resin after polymerization of the thermoplastic resin, and the solvent. The content of volatile components may be determined by analyzing the thermoplastic resin with gas chromatography.

Examples of methods of obtaining a stretched film having a volatile component content of 100 ppm by mass or less include: (a) performing oblique stretching of an unstretched film having a volatile component content of 100 ppm by mass or less; and (b) performing oblique stretching of an unstretched film having a volatile component content of more than 100 ppm by mass, and drying the film during or after the oblique stretching to reduce the volatile component content. Among these, the method (a) is preferred for obtaining a stretched film with a lower volatile component content. In the method (a), to obtain an unstretched film having a volatile component content of 100 ppm by mass or less, it is preferred to perform melt extrusion of a resin having a volatile component content of 100 ppm by mass or less.

Additionally, the stretched film used as the optical film 32 preferably has a saturated water absorption of 0.01 mass % or less, and more preferably 0.007 mass % or less. If the saturated water absorption exceeds 0.01 mass %, the stretched film may be subject to dimensional changes depending on the usage environment, and internal stress may occur. By contrast, a stretched film whose saturated water absorption is in the above range is free from display unevenness even after prolonged use, and presents great stability of optical properties.

In addition, when the saturated water absorption of the optical film 32 is 0.01 mass % or less, it is possible to suppress the change in relative permittivity of the optical film 32 over time due to water absorption. Therefore, as illustrated in FIG. 1, even if the substrate 30 having the optical film 32 is arranged between the first conductive layer 40 and the second conductive layer 20 constituting the capacitive touch sensor, it is possible to reduce variations in detection sensitivity of the touch sensor due to change in the relative permittivity of the optical film 32.

It is noted that the saturated water absorption of the stretched film may be adjusted by changing, for example, the type of the thermoplastic resin used in the formation of the film.

Also, the relative permittivity of the stretched film used as the optical film 32 is preferably 2 or more and preferably 5 or less, and particularly preferably 2.5 or less. The reason is as described below. As illustrated in FIG. 1, in this example of the display device with a capacitive touch panel 100, the substrate 30 having the optical film 32 is arranged between the first conductive layer 40 and the second conductive layer 20 constituting the capacitive touch sensor. Therefore, by decreasing the relative permittivity of the optical film 32 included in the substrate 30, it is possible to reduce the electrostatic capacity between the first conductive layer 40 and the second conductive layer 20 to improve the detection sensitivity of the capacitive touch sensor.

In addition, the optical film 32 preferably has reverse wavelength dispersion characteristics such that the phase difference imparted to light incident on the optical film is wavelength dependent, namely, the phase difference becomes larger at long wavelength and smaller at short wavelength. In this way, the phase difference imparted to light incident on the optical film increases in absolute value with increasing wavelength of the light and decreases in absolute value with decreasing wavelength of the light, and therefore, desirable polarization characteristics can be obtained over a wide wavelength range and linearly polarized light can be converted into circularly polarized light.

[[Hard Coat Layer]]

The hard coat layers 31, 33 formed on opposite surfaces of the optical film 32 are for preventing damage to and curling of the optical film 32. As the material used in the formation of the hard coat layers 31, 33, a material that shows a hardness of "HB" or higher in the pencil hardness test prescribed in HS K5700 is suitable. Examples of such materials include: organic hard coat materials such as organic silicone-based, melamine-based, epoxy-based, acrylate-based, and polyfunctional (meth)acrylic-based compounds; and inorganic hard coat materials such as silicon dioxide. Among these, (meth)acrylate-based compounds and polyfunctional (meth)acrylic-based compounds are preferably used as the hard coat layer-forming material in view of their good adhesive strength and excellent productivity. As used herein, "(meth)acrylate" refers to acrylate and/or methacrylate, and "(meth)acrylic" refers to acrylic and/or methacrylic.

Examples of (meth)acrylates include those having one polymerizable unsaturated group per molecule, those having two polymerizable unsaturated groups per molecule, those having three or more polymerizable unsaturated groups per molecule, and (meth)acrylate oligomers containing three or more polymerizable unsaturated groups per molecule. The (meth)acrylates may be used alone or in combination of two or more.

The method of forming the hard coat layers is not particularly limited. The hard coat layers are formed by: coating a coating liquid including the hard coat-forming material on the optical film 32 by a known method, such as a dipping method, a spray method, a slide coating method, a bar coating method, a roll coater method, a die coater method, a gravure coater method, and a screen printing method; removing the solvent by drying in air or in a nitrogen atmosphere or the like; and subsequently, either applying thereon an acrylic-based hard coat material and irradiating it with ultraviolet light, electron beam, or the like so as to be cured by crosslinking, or applying thereon a silicone-based, melamine-based, or epoxy-based hard coat material and causing it to thermoset. Since the film thickness of the coating film tends to become uneven during the drying process, it is preferred to adjust and control air intake and exhaust to avoid deterioration in the appearance of the coating film, so that the coating film becomes uniform over the entire surface. When using a ultraviolet curable material, the irradiation time it takes for the hard coat-forming material after the coating to be cured by being irradiated with ultraviolet light is usually in the range of 0.01 seconds to 10 seconds, and the amount of irradiation from the energy ray source is usually in the range of 40 mJ/cm$^2$ to 1000 mJ/cm$^2$ in terms of cumulative exposure with ultraviolet light wavelength of 365 nm.

The ultraviolet light irradiation may be performed in an inert gas such as nitrogen and argon, or in air.

It is noted that if the hard coat layers 31, 33 are provided, surface treatment may be applied to the stretched film used as the optical film 32 for the purpose of increasing the adhesiveness to the hard coat layers 31, 33. Examples of the surface treatment include plasma treatment, corona treatment, alkali treatment, and coating treatment. In particular, in the case where the optical film 32 is formed from a thermoplastic norbornene-based resin, the use of corona treatment allows for providing strong adhesion between the optical film 32 formed from the above thermoplastic norbornene-based resin and the hard coat layers 31, 33. As a corona treatment condition, the amount of irradiation of corona discharge electron is preferably 1 W/m$^2$/min to 1000 W/m$^2$/min. The contact angle with water of the optical film 32 after the above corona treatment is preferably from 10° to 50°. In addition, coating with the coating liquid including the hard coat-forming material may be performed immediately after the corona treatment or after neutralization. For better appearance of the hard coat layers 31, 33, however, the coating is preferably performed after neutralization.

The hard coat layers 31, 33 formed on the optical film 32 normally have an average thickness of 0.5 μm or more and 30 μm or less, and preferably 2 μm or more and 15 μm or less. If the hard coat layers 31, 33 are increased in thickness excessively out of this range, this may cause a problem with visibility, while if the hard coat layers 31, 33 are reduced in thickness excessively, this may result in poor scratch resistance.

The haze of the hard coat layers 31, 33 is 0.5% or less, and preferably 0.3% or less. By setting such haze values, the hard coat layers 31, 33 can be used suitably in the display device with a touch panel 100.

It is noted that to the hard coat layer-forming material may be added, without departing from the spirit of the disclosure, organic particles, inorganic particles, a photosensitizer, a polymerization inhibitor, a polymerization initiation aid, a leveling agent, a wettability improving agent, a surfactant, a plasticizer, an ultraviolet absorber, an antioxidant, an antistatic agent, a silane coupling agent, and the like.

It is noted that in the display device with a capacitive touch panel as disclosed herein, the substrate 30 may not have hard coat layers 31, 33, or alternatively the substrate 30 may have an optical functional layer, such as an index matching layer and a low refractive index layer, instead of or in addition to the hard coat layers 31, 33.

[[Index Matching Layer]]

Here, an index matching layer is provided (at the interface) between the optical film 32 of the substrate 30 and the conductive layer formed on the substrate 30 (in this example, the first conductive layer 40 or the second conductive layer 20), for the purpose of preventing reflection of light at the interface between the layers caused by the difference in refractive index between the optical film 32 of the substrate 30 and the conductive layer. Examples of the index matching layer include those comprising multiple high refractive index films and multiple low refractive index films that are alternately arranged, and resin layers comprising metals such as zirconia. Even if the optical film 32 and the first conductive layer 40 or the second conductive layer 20 greatly differ in refractive index, by arranging an index matching layer adjacent to the first conductive layer 40 or the second conductive layer 20 between the optical film 32 and the first conductive layer 40 or the second conductive layer 20, it is possible to prevent the reflectance from varying significantly at regions in the substrate 30 depending on whether the conductive layer is provided or not.

It is noted that even if the difference in refractive index between the substrate and the layer stacked directly on the substrate (for example, the conductive layer, hard coat layer, adhesive layer, or pressure sensitive adhesive layer) is 0.05 or more, an index layer may not be provided in the absence of the influence of interfacial reflection (for example, when the first conductive layer 40 is formed on the substrate 30 or a surface of a polarizing plate-side substrate 80 as described below on the display panel 10 side).

[[Low Refractive Index Layer]]

A low refractive index layer is provided for the purpose of preventing reflection of light and may be provided, for example, on each of the hard coat layers 31, 33. If provided on the hard coat layers 31, 33, the respective low refractive index layers represent layers, each having a refractive index lower than that of the hard coat layers 31, 33. The refractive index of each low refractive index layer is preferably in the range of 1.30 to 1.45, and more preferably in the range of 1.35 to 1.40, at 23° C. and wavelength of 550 nm.

As the low refractive index layers, inorganic compounds that are formed from $SiO_2$, $TiO_2$, NaF, $Na_3AlF_6$, LiF, $MgF_2$, $CaF_2$, SiO, $SiO_x$, $LaF_3$, $CeF_3$, $Al_2O_3$, $CeO_2$, $Nd_2O_3$, $Sb_2O_3$, $Ta_2O_5$, $ZrO_2$, ZnO, ZnS, or the like are preferred. In addition, a mixture of an inorganic compound with an organic compound such as an acrylic resin, a urethane resin, and a siloxane-based polymer is preferably used as the low refractive index layer-forming material. One example is a low refractive index layer that is formed by applying a composition containing an ultraviolet curable resin and hollow silica particles, and irradiating with ultraviolet light. The film thickness of the low refractive index layer is preferably 70 nm or more and 120 nm or less, and more preferably 80 nm or more and 110 nm or less. If the film thickness of the low refractive index layer is more than 120 nm, reflected colors are so tinged that color reproducibility is lost at the time of black presentation, which fact may reduce visibility and cause undesirable results.

In addition, as illustrated in FIG. 1, in the display device with a capacitive touch panel 100 according to this example, the first conductive layer 40 and the second conductive layer 20 constituting the capacitive touch sensor are arranged to face each other across the substrate 30 having the optical film 32. Accordingly, if the substrate 30 has a uniform thickness variation, it is possible to maintain a constant distance between the first conductive layer 40 and the second conductive layer 20 and to afford the touch sensor good detection sensitivity.

[First Conductive Layer]

The first conductive layer 40 is formed on one surface of the display panel-side protective film 51 and is positioned closer to the cover layer 60 than is the second conductive layer 20, more specifically, between the display panel-side protective film 51 and the substrate 30. Additionally, the first conductive layer 40 forms a capacitive touch sensor, in conjunction with the second conductive layer 20 positioned apart in the stacking direction across the substrate 30.

Additionally, the first conductive layer 40 may be formed by using the same material as the second conductive layer 20.

In addition, the formation of the first conductive layer 40 on the surface of the display panel-side protective film 51 may be performed by using the same method as the second conductive layer 20.

Here, the conductive layers 20, 40 constituting the capacitive touch sensor are often formed in a patterned manner. Specifically, the first conductive layer 40 and the second conductive layer 20 constituting the capacitive touch sensor may be formed in a pattern such that they form a rectilinear lattice, a wavy lattice, or a diamond-like lattice when arranged in opposition to each other and viewed in the stacking direction. It is noted that the wavy lattice refers to a shape having at least one curved section between intersections.

It is noted that the thickness of the first conductive layer 40 and of the second conductive layer 20, when formed from ITO, may be, for example, and without limitation, preferably from 10 nm to 150 nm, and more preferably from 15 nm to 70 nm. The surface resistivity of the first conductive layer 40 and of the second conductive layer 20 may preferably be, but is not particularly limited to, 100 Ω/sq to 1000 Ω/sq.

[Polarizing Plate]

The polarizing plate 50 includes a polarizing film 52, a display panel-side protective film 51 for protecting the polarizing film 52, and a cover layer-side protective film 53. As mentioned above, the transmission axis of the polarizing film 52 and the slow axis of the optical film 32 of the substrate 30 are arranged so as to intersect at about 45° as viewed in the stacking direction (the vertical direction in FIG. 1).

The polarizing plate 50 is not particularly limited, and an example thereof may be a polarizing plate 50 that is formed with the polarizing film 52 sandwiched between two protective films (display panel-side protective film 51 and cover layer-side protective film 53). It is noted that in the case of producing a laminate including the polarizing plate 50 and the substrate 30 by a roll-to-roll process, it suffices for the orientation angle of the obliquely stretched film used as the optical film 32 to be adjusted such that the slow axis of the optical film 32 and the transmission axis of the polarizing film 52 intersect at the aforementioned predetermined angle in the resulting laminate.

[Cover Layer]

The cover layer 60 may be formed by using a known member, for example, a plate that is made of glass or plastic and is transparent to visible light.

Additionally, in the display device with a capacitive touch panel 100, the circularly polarizing plate formed by the polarizing plate 50 and the substrate 30 is arranged between the cover layer 60 and the display panel 10, where the polarizing plate 50 has the polarizing film 52, and the substrate 30 has the optical film 32 with a predetermined phase difference and being arranged at a predetermined optical axis angle. This arrangement allows for preventing reflected light of incident external light from making visual recognition of the displayed content difficult. Specifically, by converting, by the optical film 32 of the substrate 30, linearly polarized light traveling from the cover layer 60 side through the polarizing plate 50 towards the display panel 10 side into circularly polarized light, and further converting, by the optical film 32 of the substrate 30, reverse circularly polarized light resulting from the circularly polarized light reflected at the display panel 10, into another linearly polarized light orthogonal to the linearly polarized light, it is possible to prevent, by the polarizing plate 50, transmission of the other linearly polarized light into the cover layer 60 side. Therefore, the display device with a capacitive touch panel 100 enables the operator to visually recognize the displayed content easily without interruption of reflected light. In addition, in the display device with a capacitive touch panel 100, since the second conductive layer 20 is provided on the substrate 30, a separate transparent base plate is not longer needed for forming the second conductive layer 20. Moreover, since the first conductive layer 40 is provided on the display panel-side protective film 51, a transparent base plate is no longer needed for forming the first conductive layer 40. Accordingly, it is possible to simplify the structure of the touch sensor and reduce the number of members present between the display panel 10 and the cover layer 60, thereby reducing the thickness between the display panel 10 and the cover layer 60. As a result, a reduction in thickness of the display device 100 can be achieved. It is noted that since the conductive layer 20 is formed on only one surface of the substrate 30 in the display device 100, a conductive layer having a uniform thickness can be formed easily as compared to the case where conductive layers are formed on both surfaces of the substrate 30.

Moreover, in the display device 100 according to the above example, since the substrate 30 is disposed between the first conductive layer 40 and the second conductive layer 20, a capacitive touch sensor can be easily formed. Further, since a film exhibiting low relative permittivity and low saturated water absorption can be used as the optical film 32 of the substrate 30, a capacitive touch sensor can be formed favorably.

Display Device with Capacitive Touch Panel
(Second Embodiment)

Figure 3:
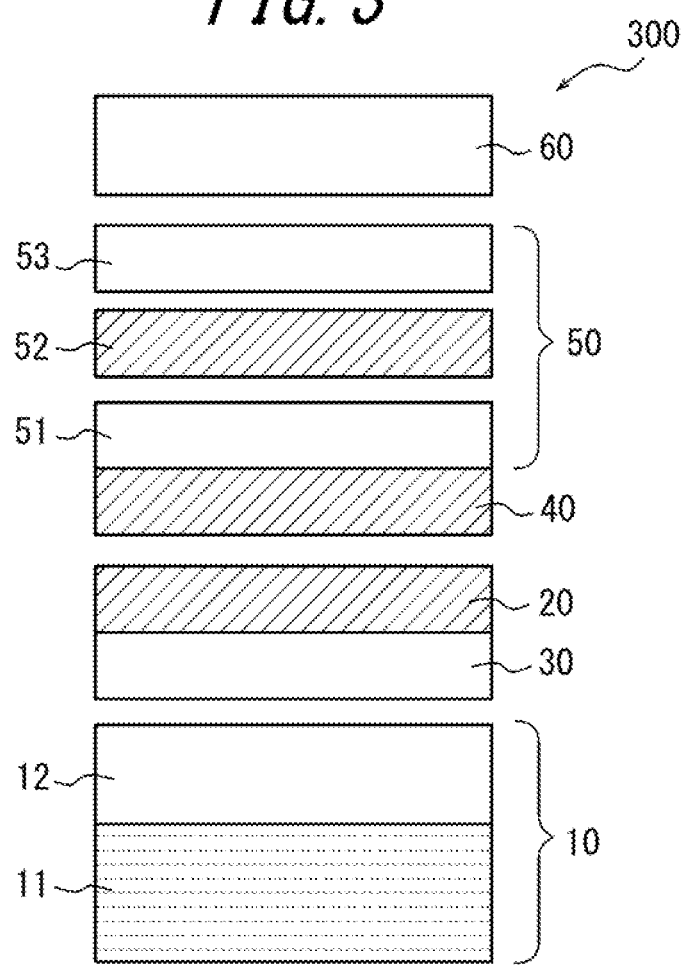
FIG. 3 is a diagram schematically illustrating a cross-sectional structure of the main part of a variation of the display device with a capacitive touch panel illustrated in FIG. 1.

A variation of the aforementioned display device with a capacitive touch panel 100 will now be described below, and the structure of the main part thereof is illustrated in FIG. 3.

The display device with a capacitive touch panel 300 illustrated in FIG. 3 differs from the example of the display device with a capacitive touch panel 100 as described previously in the following points:

the substrate 30 is positioned between the second conductive layer 20 and the display panel 10;

the first conductive layer 40 and the second conductive layer 20 are bonded together via an adhesive layer or pressure sensitive adhesive layer having low relative permittivity (not shown).

The display device with a capacitive touch panel 300 has otherwise the same features as the display device with a capacitive touch panel 100.

Here, the bonding of the substrate 30 on the barrier layer 12 may be performed by using a known adhesive layer or pressure sensitive adhesive layer.

In addition, as the adhesive layer or pressure sensitive adhesive layer used to bond the first conductive layer 40 and the second conductive layer 20 together, it is possible to use an adhesive layer or pressure sensitive adhesive layer which is formed from, for example, a resin having low relative permittivity, such as acrylic-based, urethane-based, epoxy-based, vinylalkylether-based, silicone-based, and fluorine-based resins. It is noted that from the viewpoint of forming a capacitive touch sensor favorably, the adhesive layer or pressure sensitive adhesive layer preferably has a relative permittivity of 2 or more and 5 or less.

Additionally, the display device with a capacitive touch panel 300 enables the operator to visually recognize the displayed content easily, as is the case with the example of the display device with a capacitive touch panel 100 as described previously. It is also possible to simplify the structure of the touch sensor and reduce the number of members present between the display panel 10 and the cover layer 60, thereby reducing the thickness between the display panel 10 and the cover layer 60.

Display Device with Capacitive Touch Panel (Third Embodiment)

Figure 4:
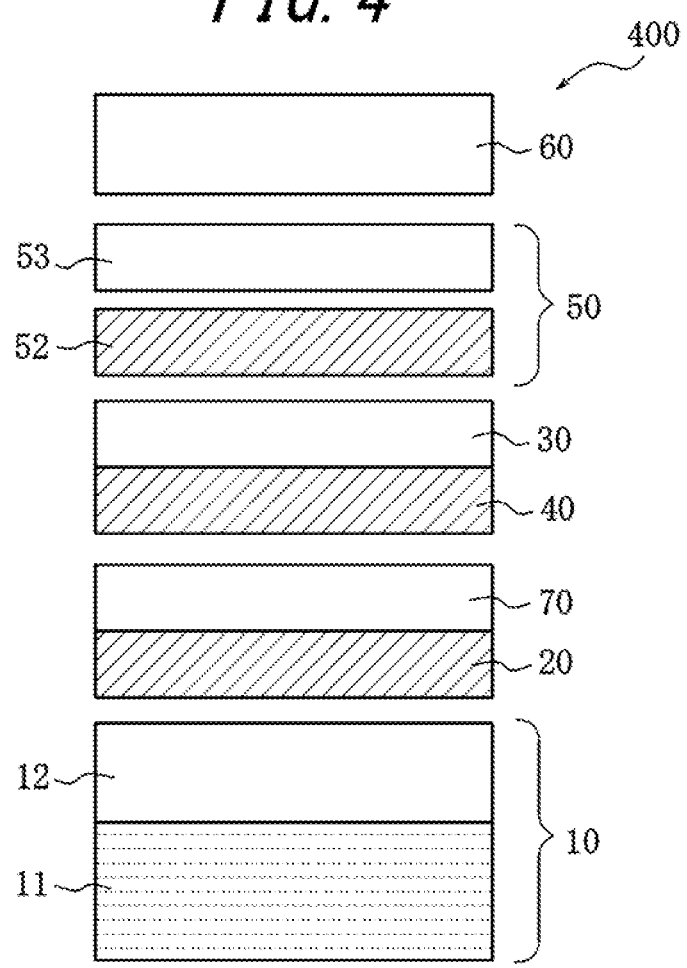
FIG. 4 is a diagram schematically illustrating a cross-sectional structure of the main part of a second display device with a capacitive touch panel according to the disclosure.

FIG. 4 schematically illustrates a cross-sectional structure of the main part of a second display device with a capacitive touch panel according to the disclosure.

Here, the display device with a capacitive touch panel 400 illustrated in FIG. 4 differs from the example of the display device with a capacitive touch panel 100 as described previously in the following points:

the polarizing plate 50 does not have the display panel-side protective film 51, and the polarizing film 52 is positioned on a surface of the polarizing plate 50 on the display panel 10 side (the lower surface in FIG. 4);

the substrate 30 is bonded to a surface, on the display panel 10 side, of the polarizing film 52 of the polarizing plate 50, and the first conductive layer 40 is formed on a surface of the substrate 30 on the display panel 10 side;

another substrate 70 is further provided on the display panel 10 side of the substrate 30, specifically between the substrate 30 and the display panel 10, and the second conductive layer 20 is formed on a surface of the other substrate 70 on the display panel 10 side; and the other substrate 70 is positioned between the first conductive layer 40 and the second conductive layer 20.

The display device with a capacitive touch panel 400 has otherwise the same features as the display device with a capacitive touch panel 100.

In this case, as the other substrate 70, a substrate layer with low relative permittivity and without phase difference may be used. Examples of the substrate layer include a film layer, an adhesive layer, and a pressure sensitive adhesive layer.

In addition, the bonding of the substrate 30 on the polarizing film 52 and the bonding of the other substrate 70 on the first conductive layer 40 may be performed by using known adhesive layers or pressure sensitive adhesive layers.

In addition, the formation of the first conductive layer 40 on the substrate 30 and the formation of the second conductive layer 20 on the other substrate 70 may be performed by using the same method as used in the formation of the conductive layers in the display device with a capacitive touch panel 100.

Additionally, the aforementioned display device with a capacitive touch panel 400 enables the operator to visually recognize the displayed content easily, as is the case with the example of the display device with a capacitive touch panel 100 as described previously. It is also possible to simplify the structure of the touch sensor and reduce the number of members present between the display panel 10 and the cover layer 60, thereby reducing the thickness between the display panel 10 and the cover layer 60. In addition, in the display device 400, a capacitive touch sensor may be formed easily and favorably by using the other substrate 70.

Moreover, in the display device with a capacitive touch panel 400, there is no need to provide an index matching layer, which fact makes it possible to simplify the structure of the touch sensor to thereby reduce the thickness between the display panel 10 and the cover layer 60. Specifically, since there is no high refractive index layer (for example, conductive layer) adjacent to the substrate 30 on the cover layer 60 side, the impact of interfacial reflection is small even if the difference in refractive index between the substrate and the layer arranged adjacent to the substrate is 0.05 or more, which fact eliminates the need for provision of an index layer.

It is noted that in the display device 400, it is possible to cause the substrate 30 to function as a protective film for the polarizing film 52, which may thus make the display panel-side protective film 51 of the polarizing plate 50 unnecessary, thereby reducing the thickness of the polarizing plate 50. Accordingly, it is possible to further reduce the thickness between the display panel 10 and the cover layer 60.

Here, in the display device 400, the optical film 32 and the polarizing film 52 may be bonded together by using, as the substrate 30, a substrate that does not have the hard coat layer 33 on the polarizing film 52 side of the optical film 32 (namely, a substrate having the optical film 32 positioned on the surface thereof on the cover layer 60 side). If not only the display panel-side protective film 51 of the polarizing plate 50, but also the hard coat layer 33 of the substrate 30 is no longer needed, the thickness between the display panel 10 and the cover layer 60 can be reduced even more.

Display Device with Capacitive Touch Panel (Forth Embodiment)

Figure 5:
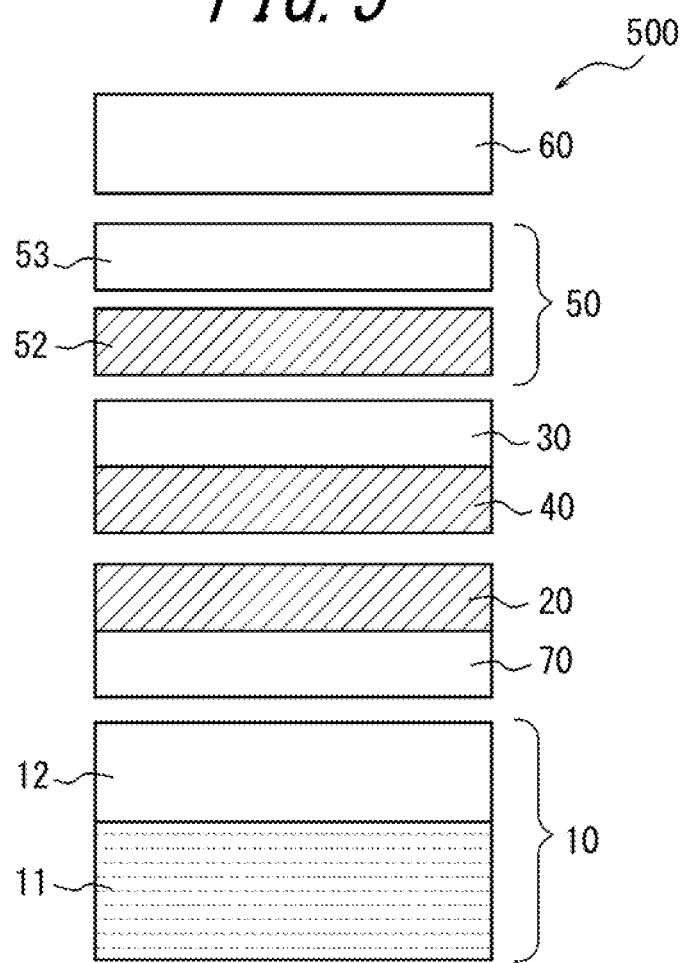
FIG. 5 is a diagram schematically illustrating a cross-sectional structure of the main part of a variation of the display device with a capacitive touch panel illustrated in FIG. 4.

A variation of the aforementioned display device with a capacitive touch panel 400 will now be described below, and the structure of the main part thereof is illustrated in FIG. 5.

The display device with a capacitive touch panel 500 illustrated in FIG. 5 differs from the example of the display device with a capacitive touch panel 400 as described previously in the following points:

the other substrate 70 is positioned between the second conductive layer 20 and the display panel 10; and the first conductive layer 40 and the second conductive layer 20 are bonded together via an adhesive layer or pressure sensitive adhesive layer having low relative permittivity (not shown).

The display device with a capacitive touch panel 500 has otherwise the same features as the display device with a capacitive touch panel 400.

Here, the bonding of the other substrate 70 on the barrier layer 12 may be performed by using a known adhesive layer or pressure sensitive adhesive layer.

In addition, as the adhesive layer or pressure sensitive adhesive layer used to bond the first conductive layer 40 and the second conductive layer 20 together, it is possible to use the same adhesive layer or pressure sensitive adhesive layer as that used in the display device with a capacitive touch panel 300 which is formed from, for example, a resin having low relative permittivity, such as acrylic-based, urethane-based, epoxy-based, vinylalkylether-based, silicone-based, and fluorine-based resins.

Additionally, the aforementioned display device with a capacitive touch panel 500 enables the operator to visually recognize the displayed content easily, as is the case with the example of the display device with a capacitive touch panel 400 as described previously. It is also possible to simplify the structure of the touch sensor and reduce the number of members present between the display panel 10 and the cover layer 60, thereby reducing the thickness between the display panel 10 and the cover layer 60.

Moreover, in the display device with a capacitive touch panel 500, there is no need to provide an index matching layer, which fact makes it possible to simplify the structure of the touch sensor to thereby reduce the thickness between the display panel 10 and the cover layer 60.

It is noted that in the display device 500, it is possible to cause the substrate 30 to function as a protective film for the polarizing film 52, which may thus make the display panel-side protective film 51 of the polarizing plate 50 unnecessary, thereby reducing the thickness of the polarizing plate 50. Accordingly, it is possible to further reduce the thickness between the display panel 10 and the cover layer 60.

Display Device with Capacitive Touch Panel (Fifth Embodiment)

Figure 6:
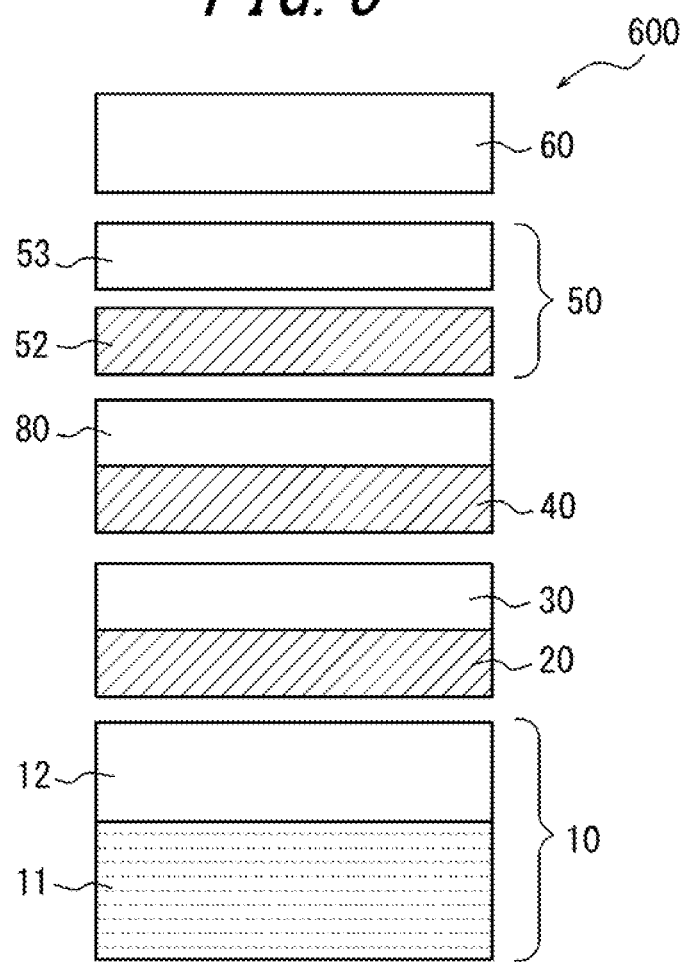
FIG. 6 is a diagram schematically illustrating a cross-sectional structure of the main part of a third display device with a capacitive touch panel according to the disclosure.

FIG. 6 schematically illustrates a cross-sectional structure of the main part of a third display device with a capacitive touch panel according to the disclosure.

Here, the display device with a capacitive touch panel 600 illustrated in FIG. 6 differs from the example of the display device with a capacitive touch panel 100 as described previously in the following points:

the polarizing plate 50 does not have the display panel-side protective film 51, and the polarizing film 52 is positioned on a surface of the polarizing plate 50 on the display panel 10 side (the lower surface in FIG. 6);

a polarizing plate-side substrate 80 is further provided between the substrate 30 and the polarizing plate 50, and the circularly polarizing plate is formed by the substrate 30, the polarizing plate-side substrate 80, and the polarizing plate 50, the polarizing plate-side substrate 80 is bonded to a surface, on the display panel 10 side, of the polarizing film 52 of the polarizing plate 50, and the first conductive layer 40 is formed on a surface of the polarizing plate-side substrate 80 on the display panel 10 side;

the polarizing plate-side substrate 80 has another optical film with a phase difference of $\lambda/2$; and the slow axis of the optical film 32, the slow axis of the other optical film, and the transmission axis of the polarizing film 52 intersect at a predetermined angle.

The display device with a capacitive touch panel 600 has otherwise the same features as the display device with a capacitive touch panel 100.

Here, the bonding of the polarizing plate-side substrate 80 on the polarizing film 52 may be performed by using a known adhesive layer or pressure sensitive adhesive layer.

In addition, the formation of the first conductive layer 40 on the polarizing plate-side substrate 80 may be performed by using the same method as used in the formation of the conductive layers in the display device with a capacitive touch panel 100.

The polarizing plate-side substrate 80 differs from the substrate 30 in the feature that it has another optical film with a phase difference of $\lambda/2$ instead of the optical film with a phase difference of $\lambda/4$, yet it has otherwise the same features as the substrate 30. Additionally, the other optical film may be produced by using the same material and method as those used for the optical film 32.

As used herein, the phrase "with a phase difference of $\lambda/2$" indicates that the phase difference (retardation Re) to be applied to light transmitted through the other optical film of the polarizing plate-side substrate 80 in the stacking direction is about ½ times the wavelength $\lambda$ of the light. Specifically, in the case where the transmitted light has a wavelength range from 400 nm to 700 nm, and when Re is about ½ times the wavelength $\lambda$, it is meant that Re is in the range of $\lambda/2\pm65$ nm, preferably in the range of $\lambda/2\pm30$ nm, and more preferably in the range of $\lambda/2\pm10$ nm. It is noted that Re is the retardation in the in-plane direction represented by the equation $Re=(nx-ny)\times d$, where nx is the refractive index in the film plane in the slow axis direction, ny is the refractive index in a direction orthogonal, in the film plane, to the slow axis in the film plane, and d is the thickness of the other optical film.

In addition, the optical film 32 and the other optical film of the polarizing plate-side substrate 80 represent two optical plates (so-called wideband quarter wavelength plates) that impart a phase difference of $\lambda/4$ when used in a pair, and are preferably formed from the same material having the same wavelength dispersion characteristics.

Moreover, the optical film 32 and the other optical film of the polarizing plate-side substrate 80 are arranged so that the slow axis of the optical film 32 intersects the transmission axis of the polarizing film 52 of the polarizing plate 50, and the slow axis of the other optical film of the polarizing plate-side substrate 80 intersects the transmission axis of the polarizing film 52 of the polarizing plate 50, at predetermined angles as viewed in the stacking direction, respectively.

As used herein, "predetermined angles" refers to angles at which a wideband quarter wavelength plate can be formed, specifically angles at which linearly polarized light A traveling from the cover layer 60 side through the polarizing plate 50 towards the display panel 10 side is converted, after passing through the other optical film and the optical film 32 sequentially, into circularly polarized light A, and reverse circularly polarized light B resulting from the circularly polarized light A reflected at the display panel 10 is converted, after passing through the optical film 32 and the other optical film sequentially, into another linearly polarized light B orthogonal to the linearly polarized light A.

Specifically, if it is now assumed that the other optical film and the optical film 32 have the same wavelength dispersion characteristics, "predetermined angles" means angles at which the following equation holds: X−2Y=45°, where X° is an angle at which the slow axis of the optical film 32 intersects the transmission axis of the polarizing film 52, and Y° is an angle at which the slow axis of the other optical film of the polarizing plate-side substrate 80 intersects the transmission axis of the polarizing film 52. More specifically, for example, possible combinations of "predetermined angles" include: (i) about 75° at which the slow axis of the optical film 32 intersects the transmission axis of the polarizing film 52 and about 15° at which the slow axis of the other optical film of the polarizing plate-side substrate 80 intersects the transmission axis of the polarizing film 52, and (ii) about 90° at which the slow axis of the optical film 32 intersects the transmission axis of the polarizing film 52 and about 22.5° at which the slow axis of the other optical film of the polarizing plate-side substrate 80 intersects the transmission axis of the polarizing film 52.

As used herein, "about 75°" more specifically covers angles of 75°±5°, preferably 75°±3°, more preferably 75°±1°, and even more preferably 75°±0.3°, "about 15°" more specifically covers angles of 15°±5°, preferably 15°±3°, more preferably 15°±1°, and even more preferably 15°±0.3°, "about 90°" more specifically covers angles of 90°±5°, preferably 90°±3°, more preferably 90°±1°, and even more preferably 90°±0.3°, and "about 22.5°" more specifically covers angles of 22.5°±5°, preferably 22.5°±3°, more preferably 22.5°±1°, and even more preferably 22.5°±0.3°.

In view of the fact that the laminate formed with the polarizing plate 50 can be produced easily by a roll-to-roll process, the optical film 32 is preferably a vertical stretched film when forming an intersection angle of about 90° with the transmission axis of the polarizing film 52, and alternatively the optical film 32 is preferably an obliquely stretched film when forming an intersection angle of about 75° with the transmission axis of the polarizing film 52, and the other optical film is preferably an obliquely stretched film when forming an intersection angle of about 15° with the transmission axis of the polarizing film 52, and alternatively the other optical film is preferably an obliquely stretched film when forming an intersection angle of about 22.5° with the transmission axis of the polarizing film 52, respectively.

Additionally, the aforementioned display device with a capacitive touch panel 600 enables the operator to visually recognize the displayed content easily, as is the case with the example of the display device with a capacitive touch panel 100 as described previously. It is also possible to simplify the structure of the touch sensor and reduce the number of members present between the display panel 10 and the cover layer 60, thereby reducing the thickness between the display panel 10 and the cover layer 60. In addition, in the display device 600, a capacitive touch sensor may be formed easily and favorably by using the substrate 30.

Moreover, in the display device with a capacitive touch panel 600, there is no need to provide an index matching layer, which fact makes it possible to simplify the structure of the touch sensor to thereby reduce the thickness between the display panel and the cover layer.

It is noted that in the display device 600, it is possible to cause the polarizing plate-side substrate 80 to function as a protective film for the polarizing film 52, which may thus make the display panel-side protective film 51 of the polarizing plate 50 unnecessary, thereby reducing the thickness of the polarizing plate 50. Accordingly, it is possible to further reduce the thickness between the display panel 10 and the cover layer 60.

In addition, in the display device 600, it is possible to form a so-called wideband quarter wavelength plate by using the optical film 32 and the other optical film of the polarizing plate-side substrate 80, to yield desired polarization characteristics in a wide wavelength range, and to convert linearly polarized light into circularly polarized light favorably.

Display Device with Capacitive Touch Panel (Sixth Embodiment)

Figure 7:
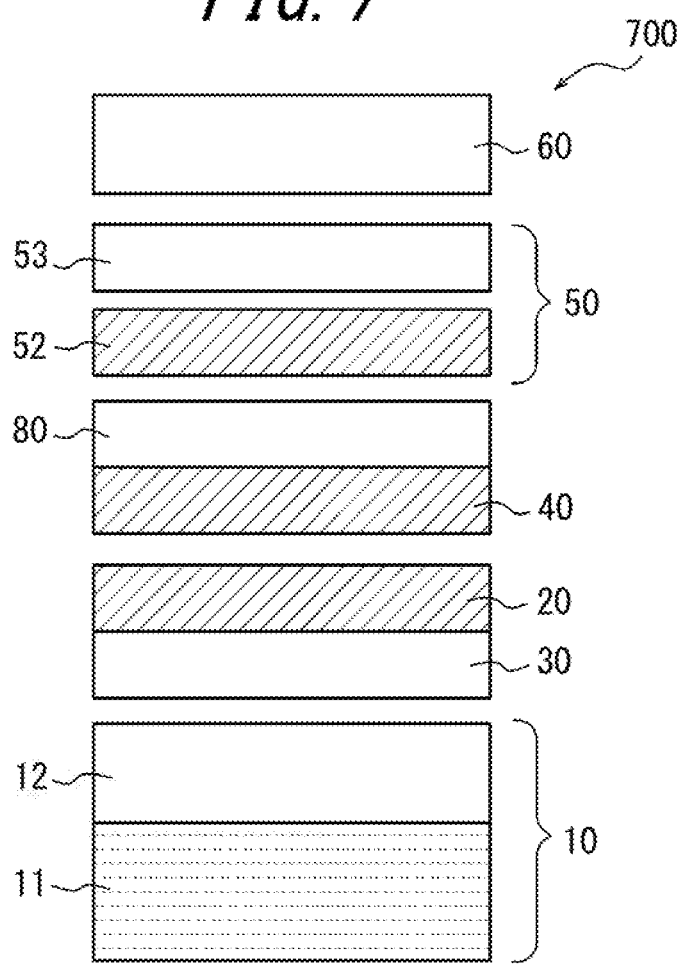
FIG. 7 is a diagram schematically illustrating a cross-sectional structure of the main part of a variation of the display device with a capacitive touch panel illustrated in FIG. 6.

A variation of the aforementioned display device with a capacitive touch panel 600 will now be described below, and the structure of the main part thereof is illustrated in FIG. 7.

The display device with a capacitive touch panel 700 illustrated in FIG. 7 differs from the example of the display device with a capacitive touch panel 600 as described previously in the following points:

the substrate 30 is positioned between the second conductive layer 20 and the display panel 10; and the first conductive layer 40 and the second conductive layer 20 are bonded together via an adhesive layer or pressure sensitive adhesive layer having low relative permittivity (not shown).

The display device with a capacitive touch panel 700 has otherwise the same features as the display device with a capacitive touch panel 600.

Here, the bonding of the substrate 30 on the barrier layer 12 may be performed by using a known adhesive layer or pressure sensitive adhesive layer.

In addition, as the adhesive layer or pressure sensitive adhesive layer used to bond the first conductive layer 40 and the second conductive layer 20 together, it is possible to use the same adhesive layer or pressure sensitive adhesive layer as that used in the display device with a capacitive touch panel 300 which is formed from, for example, a resin having low relative permittivity, such as acrylic-based, urethane-based, epoxy-based, vinylalkylether-based, silicone-based, and fluorine-based resins.

Additionally, the aforementioned display device with a capacitive touch panel 700 enables the operator to visually recognize the displayed content easily, as is the case with the example of the display device with a capacitive touch panel 600 as described previously. It is also possible to simplify the structure of the touch sensor and reduce the number of members present between the display panel 10 and the cover layer 60, thereby reducing the thickness between the display panel 10 and the cover layer 60. In addition, in the display device 700, a capacitive touch sensor may be formed easily and favorably by using the substrate 30.

Moreover, in the display device with a capacitive touch panel 700, there is no need to provide an index matching layer, which fact makes it possible to simplify the structure of the touch sensor to thereby reduce the thickness between the display panel and the cover layer.

In addition, as is the case with the aforementioned example of the display device 600, the thickness of the polarizing plate 50 can be reduced by eliminating the need for the display panel-side protective film 51 of the polarizing plate 50. Moreover, it is possible to form a so-called wideband quarter wavelength plate by using the optical film 32 and the other optical film of the polarizing plate-side substrate 80, to yield desired polarization characteristics in a wide wavelength range, and to convert linearly polarized light into circularly polarized light favorably.

Display Device with Capacitive Touch Panel (Seventh Embodiment)

Figure 8:
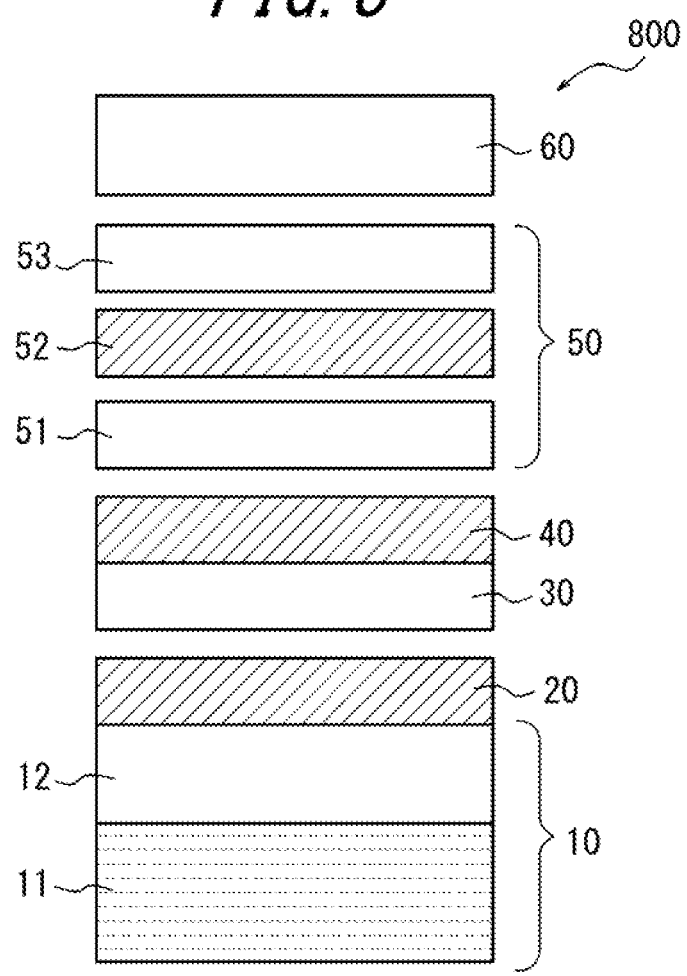
FIG. 8 is a diagram schematically illustrating a cross-sectional structure of the main part of a fourth display device with a capacitive touch panel according to the disclosure.

FIG. 8 schematically illustrates a cross-sectional structure of the main part of a fourth display device with a capacitive touch panel according to the disclosure.

Here, the display device with a capacitive touch panel 800 illustrated in FIG. 8 differs from the example of the display device with a capacitive touch panel 100 as described previously in the following points:

the first conductive layer 40 is formed on a surface of the substrate 30 on the cover layer 60 side; and
the second conductive layer 20 is formed on a surface of the barrier glass 12 on the cover layer 60 side.

The display device with a capacitive touch panel 800 has otherwise the same features as the display device with a capacitive touch panel 100.

Here, the bonding of the first conductive layer 40 on the display panel-side protective film 51 and the bonding of the substrate 30 on the second conductive layer 20 may be performed by using a known adhesive layer or pressure sensitive adhesive layer.

In addition, the formation of the first conductive layer 40 on the substrate 30 and the formation of the second conductive layer 20 on the barrier glass 12 may be performed by using the same method as used in the formation of the conductive layers in the display device with a capacitive touch panel 100.

Additionally, the aforementioned display device with a capacitive touch panel 800 enables the operator to visually recognize the displayed content easily, as is the case with the example of the display device with a capacitive touch panel 100 as described previously. It is also possible to simplify the structure of the touch sensor and reduce the number of members present between the display panel 10 and the cover layer 60, thereby reducing the thickness between the display panel 10 and the cover layer 60. In addition, in the display device 800, a capacitive touch sensor may be formed easily and favorably by using the substrate 30.

Display Device with Capacitive Touch Panel (Eighth Embodiment)

Figure 9:
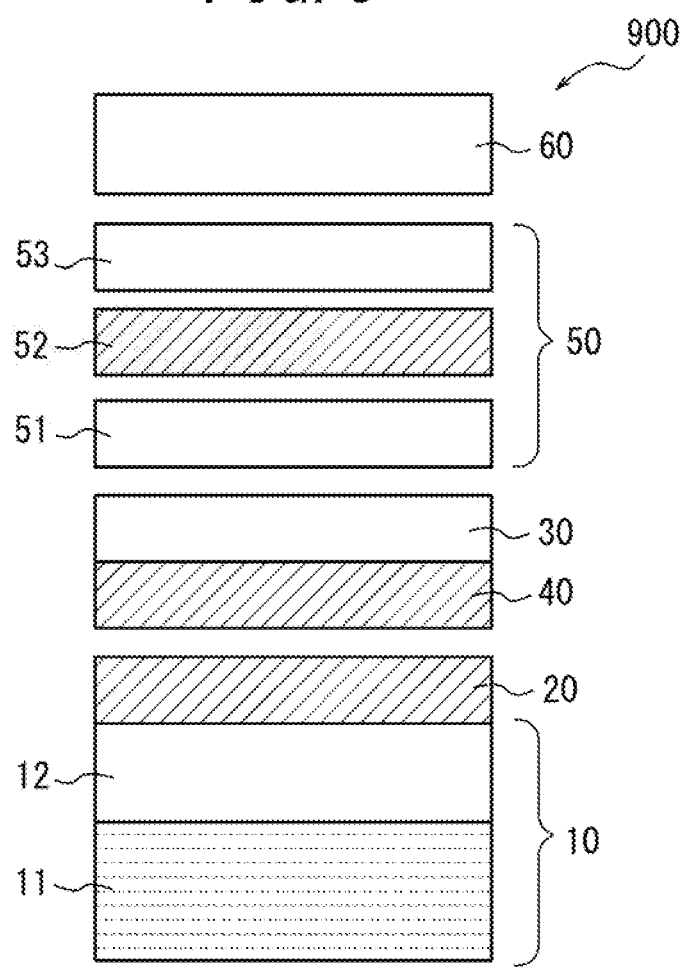
FIG. 9 is a diagram schematically illustrating a cross-sectional structure of the main part of a variation of the display device with a capacitive touch panel illustrated in FIG. 8.

A variation of the aforementioned display device with a capacitive touch panel 800 will now be described below, and the structure of the main part thereof is illustrated in FIG. 9.

The display device with a capacitive touch panel 900 illustrated in FIG. 9 differs from the example of the display device with a capacitive touch panel 800 as described previously in the following points:

the substrate 30 is positioned between the first conductive layer 40 and the display panel-side protective film 51; and
the first conductive layer 40 and the second conductive layer 20 are bonded together via an adhesive layer or pressure sensitive adhesive layer having low relative permittivity (not shown).

The display device with a capacitive touch panel 900 has otherwise the same features as the display device with a capacitive touch panel 800.

Here, the bonding of the substrate 30 on the display panel-side protective film 51 may be performed by using a known adhesive layer or pressure sensitive adhesive layer.

In addition, as the adhesive layer or pressure sensitive adhesive layer used to bond the first conductive layer 40 and the second conductive layer 20 together, it is possible to use the same adhesive layer or pressure sensitive adhesive layer as that used in the display device with a capacitive touch panel 300 which is formed from, for example, a resin having low relative permittivity, such as acrylic-based, urethane-based, epoxy-based, vinylalkylether-based, silicone-based, and fluorine-based resins.

Additionally, the aforementioned display device with a capacitive touch panel 900 enables the operator to visually recognize the displayed content easily, as is the case with the example of the display device with a capacitive touch panel 800 as described previously. It is also possible to simplify the structure of the touch sensor and reduce the number of members present between the display panel 10 and the cover layer 60, thereby reducing the thickness between the display panel 10 and the cover layer 60.

Moreover, in the display device with a capacitive touch panel 900, there is no need to provide an index matching layer, which fact makes it possible to simplify the structure of the touch sensor to thereby reduce the thickness between the display panel 10 and the cover layer 60.

Display Device with Capacitive Touch Panel (Ninth Embodiment)

Figure 10:
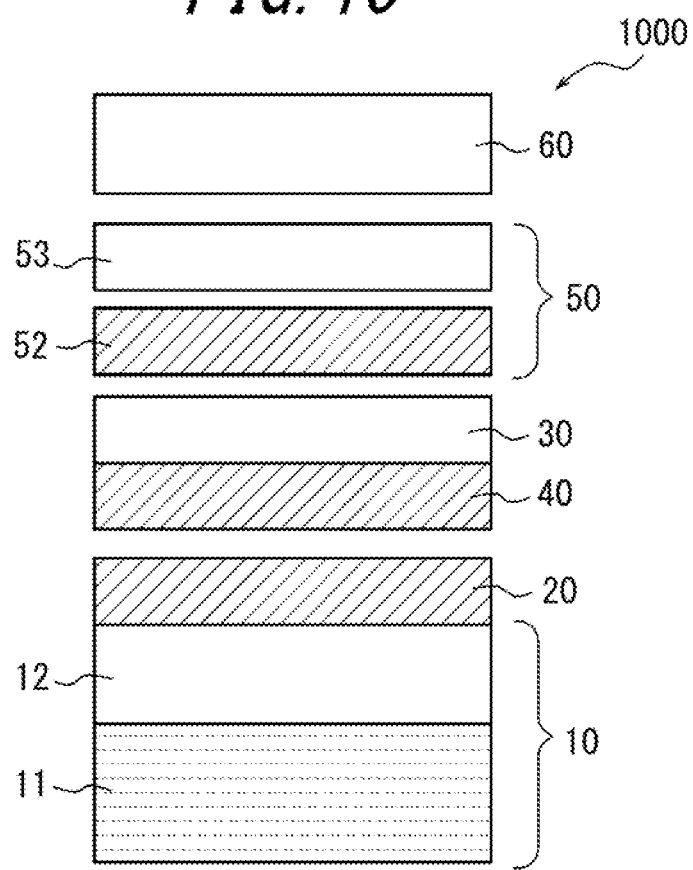
FIG. 10 is a diagram schematically illustrating a cross-sectional structure of the main part of a variation of the display device with a capacitive touch panel illustrated in FIG. 9.

A variation of the aforementioned display device with a capacitive touch panel 900 will now be described below, and the structure of the main part thereof is illustrated in FIG. 10.

The display device with a capacitive touch panel 1000 illustrated in FIG. 10 differs from the example of the display device with a capacitive touch panel 900 as described previously in the following points:

the polarizing plate 50 does not have the display panel-side protective film 51, and the polarizing film 52 is positioned on a surface of the polarizing plate 50 on the display panel 10 side (the lower surface in FIG. 10); and
the substrate 30 is bonded to a surface, on the display panel 10 side, of the polarizing film 52 of the polarizing plate 50.

The display device with a capacitive touch panel 1000 have otherwise the same features as the display device with a capacitive touch panel 900.

Here, the bonding of the substrate 30 on the polarizing film 52 may be performed by using a known adhesive layer or pressure sensitive adhesive layer.

In addition, as the adhesive layer or pressure sensitive adhesive layer used to bond the first conductive layer 40 and the second conductive layer 20 together, it is possible to use the same adhesive layer or pressure sensitive adhesive layer as that used in the display device with a capacitive touch panel 300 which is formed from, for example, a resin having low relative permittivity, such as acrylic-based, urethane-based, epoxy-based, vinylalkylether-based, silicone-based, and fluorine-based resins.

Additionally, the aforementioned display device with a capacitive touch panel 1000 enables the operator to visually recognize the displayed content easily, as is the case with the example of the display device with a capacitive touch panel 900 as described previously. It is also possible to simplify the structure of the touch sensor and reduce the number of members present between the display panel 10 and the cover layer 60, thereby reducing the thickness between the display panel 10 and the cover layer 60.

Moreover, in the display device with a capacitive touch panel 1000, there is no need to provide an index matching layer, which fact makes it possible to simplify the structure of the touch sensor to thereby reduce the thickness between the display panel 10 and the cover layer 60.

In addition, in the display device 1000, it is possible to cause the substrate 30 to function as a protective film for the polarizing film 52, which may thus make the display panel-side protective film 51 of the polarizing plate 50 unnecessary, thereby reducing the thickness of the polarizing plate 50. Accordingly, it is possible to further reduce the thickness between the display panel 10 and the cover layer 60.

Here, in the display device 1000, the optical film 32 and the polarizing film 52 may be bonded together by using, as the substrate 30, a substrate that does not have the hard coat layer 33 on the polarizing film 52 side of the optical film 32 (namely, a substrate having the optical film 32 positioned on the surface thereof on the cover layer 60 side). If not only the display panel-side protective film 51 of the polarizing plate 50, but also the hard coat layer 33 of the substrate 30 is no longer needed, the thickness between the display panel 10 and the cover layer 60 can be reduced even more.

Display Device with Capacitive Touch Panel (Tenth Embodiment)

Figure 11:
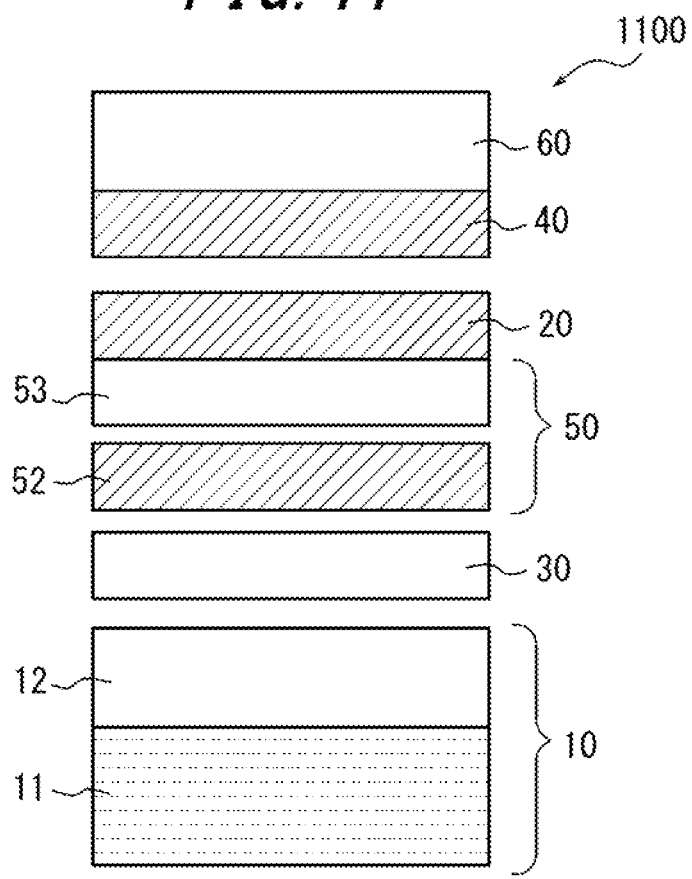
FIG. 11 is a diagram schematically illustrating a cross-sectional structure of the main part of a fifth display device with a capacitive touch panel according to the disclosure.

FIG. 11 schematically illustrates a cross-sectional structure of the main part of a fifth display device with a capacitive touch panel according to the disclosure.

Here, the display device with a capacitive touch panel 1100 illustrated in FIG. 11 differs from the example of the display device with a capacitive touch panel 100 as described previously in the following points:
the first conductive layer 40 is formed on a surface of the cover layer 60 on the display panel 10 side;
the second conductive layer 20 is formed on a surface of the cover layer-side protective film 53 on the cover layer 60 side;
the polarizing plate 50 does not have the display panel-side protective film 51, and the polarizing film 52 is positioned on a surface of the polarizing plate 50 on the display panel 10 side (the lower surface in FIG. 11);
the substrate 30 is bonded to a surface, on the display panel 10 side, of the polarizing film 52 of the polarizing plate 50;
the substrate 30 is bonded to a surface of the barrier layer 12 on the cover layer 60 side; and
the first conductive layer 40 and the second conductive layer 20 are bonded together via an adhesive layer or pressure sensitive adhesive layer having low relative permittivity (not shown).

The display device with a capacitive touch panel 1100 has otherwise the same features as the display device with a capacitive touch panel 100.

Here, the bonding of the substrate 30 on the polarizing film 52 and on the barrier layer 12 may be performed by using known adhesive layers or pressure sensitive adhesive layers, respectively.

In addition, the formation of the first conductive layer 40 on the cover layer 60 and the formation of the second conductive layer 20 on the cover layer-side protective film 53 may be performed by using the same method as used in the formation of the conductive layers in the display device with a capacitive touch panel 100.

Additionally, the aforementioned display device with a capacitive touch panel 1100 enables the operator to visually recognize the displayed content easily, as is the case with the example of the display device with a capacitive touch panel 100 as described previously. It is also possible to simplify the structure of the touch sensor and reduce the number of members present between the display panel 10 and the cover layer 60, thereby reducing the thickness between the display panel 10 and the cover layer 60.

Here, in the display device 1100, the optical film 32 and the polarizing film 52 may be bonded together by using, as the substrate 30, a substrate that does not have the hard coat layer 33 on the polarizing film 52 side of the optical film 32 (namely, a substrate having the optical film 32 positioned on the surface thereof on the cover layer 60 side). If not only the display panel-side protective film 51 of the polarizing plate 50, but also the hard coat layer 33 of the substrate 30 is no longer needed, the thickness between the display panel 10 and the cover layer 60 can be reduced even more.

Moreover, in the display device with a capacitive touch panel 1100, since the first conductive layer 40 and the second conductive layer 20 constituting the capacitive touch sensor are disposed between the cover layer 60 and the polarizing plate 50, it is possible to maintain a sufficient distance, even in the device with a reduced thickness, between the display panel 10 and the first conductive layer 40 and second conductive layer 20 constituting the touch sensor, and to suppress a decrease in sensitivity of the touch sensor caused by the influence of electrical noise from the display panel 10 side, as compared to the case where the first conductive layer 40 and the second conductive layer 20 are provided closer to the display panel 10 than is the polarizing plate 50.

It is noted that in the display device 1100, it is possible to cause the substrate 30 to function as a protective film for the polarizing film 52, which may thus make the display panel-side protective film 51 of the polarizing plate 50 unnecessary, thereby reducing the thickness of the polarizing plate 50. Accordingly, it is possible to further reduce the thickness between the display panel 10 and the cover layer 60.

While examples of the display device with a capacitive touch panel according to the disclosure have been described above, the display device with a capacitive touch panel according to the disclosure is not limited to the above examples, but is capable of modifications as deemed appropriate. Specifically, if the display device with a capacitive touch panel according to the disclosure (the first to ninth embodiments) has any additional member other than the substrate, one of the first conductive layer and the second conductive layer that is not formed on the surface of the substrate may be formed on a surface of the additional member.

INDUSTRIAL APPLICABILITY

According to the disclosure, it is possible to provide a display device with a capacitive touch panel that can prevent reflected light of incident external light from making visual recognition of the displayed content difficult, and that is reduced in thickness.

REFERENCE SIGNS LIST

10 Display panel
11 Organic EL display (OLED) panel
12 Barrier layer
20 Second conductive layer
30 Substrate
31, 33 Hard coat layer
32 Optical film
40 First conductive layer
50 Polarizing plate
51 Display panel-side protective film
52 Polarizing film 53 Cover layer-side protective film
60 Cover layer
70 Another substrate
80 Polarizing plate-side substrate
100, 300, 400, 500, 600, 700, 800, 900, 1000, 1100 Display device with capacitive touch panel

The invention claimed is:

1. A display device with a capacitive touch panel comprising a laminate between a display panel and a cover layer, the laminate having a circularly polarizing plate, a first conductive layer, and a second conductive layer, wherein
the circularly polarizing plate comprises a substrate and a polarizing plate,
the first conductive layer, the second conductive layer, and the substrate are positioned closer to the display panel than is the polarizing plate, and the first conductive layer is positioned closer to the cover layer than is the second conductive layer,
the first conductive layer and the second conductive layer are arranged apart from each other in a stacking direction so as to form a capacitive touch sensor,
one of the first conductive layer and the second conductive layer is formed on one surface of the substrate,
the substrate has an optical film with a phase difference of $\lambda/4$,
the polarizing plate has a polarizing film,
the polarizing plate has a display panel-side protective film on a surface of the polarizing film on the side of the display panel,
the first conductive layer is formed on a surface of the display panel-side protective film on the side of the display panel,
the second conductive layer is formed on one surface of the substrate, and
a slow axis of the optical film intersects a transmission axis of the polarizing film at an angle of about 45° as viewed in the stacking direction.

2. The display device with a capacitive touch panel according to claim 1, wherein the substrate is positioned between the first conductive layer and the second conductive layer.

3. The display device with a capacitive touch panel according to claim 1, wherein the substrate is positioned between the second conductive layer and the display panel.

4. The display device with a capacitive touch panel according to claim 1, wherein the optical film has reverse wavelength dispersion characteristics.

5. The display device with a capacitive touch panel according to claim 1, wherein the optical film has a relative permittivity of 2 or more and 5 or less.

6. The display device with a capacitive touch panel according to claim 1, wherein the optical film has a saturated water absorption of 0.01 mass % or less.

7. The display device with a capacitive touch panel according to claim 1, wherein the optical film is an obliquely stretched film.

8. The display device with a capacitive touch panel according to claim 1, wherein the optical film is formed from a cycloolefin polymer, polycarbonate, polyethylene terephthalate, or triacetylcellulose.

9. The display device with a capacitive touch panel according to claim 1, wherein the optical film is a cycloolefin polymer without a polar group.

10. The display device with a capacitive touch panel according to claim 1, wherein the first conductive layer and the second conductive layer are formed by using indium oxide, carbon nanotubes, or silver nanowires.

11. The display device with a capacitive touch panel according to claim 1, wherein the display panel comprises an organic EL display panel.

* * * * *